(12) United States Patent
Tong et al.

(10) Patent No.: US 8,632,196 B2
(45) Date of Patent: Jan. 21, 2014

(54) LED LAMP INCORPORATING REMOTE PHOSPHOR AND DIFFUSER WITH HEAT DISSIPATION FEATURES

(75) Inventors: Tao Tong, Oxnard, CA (US); Ronan Letoquin, Fremont, CA (US); Bernd Keller, Santa Barbara, CA (US); Eric Tarsa, Goleta, CA (US)

(73) Assignee: Cree, Inc., Durham, NC (US)

( * ) Notice: Subject to any disclaimer, the term of this patent is extended or adjusted under 35 U.S.C. 154(b) by 146 days.

(21) Appl. No.: 13/029,005

(22) Filed: Feb. 16, 2011

(65) Prior Publication Data

US 2011/0215700 A1   Sep. 8, 2011

Related U.S. Application Data

(63) Continuation-in-part of application No. 12/848,825, filed on Aug. 2, 2010, now Pat. No. 8,562,161.

(60) Provisional application No. 61/339,516, filed on Mar. 3, 2010, provisional application No. 61/339,515, filed on Mar. 3, 2010, provisional application No. 61/386,437, filed on Sep. 24, 2010, provisional application No. 61/424,665, filed on Dec. 19, 2010, provisional application No. 61/424,670, filed on Dec. 19, 2010, provisional application No. 61/434,355, filed on Jan. 19, 2011, provisional application No. 61/435,326, filed on Jan. 23, 2011, provisional application No. 61/435,759, filed on Jan. 24, 2011.

(51) Int. Cl.
*F21V 9/16* (2006.01)

(52) U.S. Cl.
USPC .............................. 362/84; 362/294

(58) Field of Classification Search
USPC ................. 362/84, 235, 294; 313/46
See application file for complete search history.

(56) References Cited

U.S. PATENT DOCUMENTS

| 4,727,289 A | 2/1988 | Uchida |
| 5,140,220 A | 8/1992 | Hasegawa |

(Continued)

FOREIGN PATENT DOCUMENTS

| CN | 1013388887 A | 1/2009 |
| DE | 4311937 A1 | 10/1994 |

(Continued)

OTHER PUBLICATIONS

International Search Report and Written Opinion for PCT Patent Application No. PCT/US2011/000405 mailed Nov. 2, 2011.

(Continued)

*Primary Examiner* — Evan Dzierzynski
(74) *Attorney, Agent, or Firm* — Koppel, Patrick, Heybl & Philpott

(57) ABSTRACT

An LED lamp or bulb is disclosed that comprises a light source, a heat sink structure and a remote phosphor carrier having at least one conversion material. The phosphor carrier can be remote to the light sources and mounted to the heat sink so that heat from the phosphor carrier spreads into the heat sink. The phosphor carrier can have a three-dimensional shape, and can comprise a thermally conductive transparent material and a phosphor layer, with an LED based light source mounted to the heat sink such that light from the light source passes through the phosphor carrier. At least some of the LED light is converted by the phosphor carrier, with some lamp embodiments emitting a white light combination of LED and phosphor light. The phosphors in the phosphor carriers can be arranged to operate at a lower temperature to thereby operate at greater phosphor conversion efficiency and with reduced heat related damage to the phosphor. The lamps or bulbs can also comprise a diffuser over the phosphor carrier to distribute light and to conceal the phosphor carrier.

51 Claims, 10 Drawing Sheets

(56) References Cited

U.S. PATENT DOCUMENTS

| | | |
|---|---|---|
| 5,535,230 A | 7/1996 | Abe |
| 5,561,346 A | 10/1996 | Byrne |
| 5,581,683 A | 12/1996 | Bertignoll |
| 5,688,042 A | 11/1997 | Madadi |
| 5,850,126 A | 12/1998 | Kanbar |
| 5,931,570 A | 8/1999 | Yamuro |
| 5,956,106 A | 9/1999 | Petersen |
| 5,959,316 A | 9/1999 | Lowery |
| 6,350,041 B1 | 2/2002 | Tarsa |
| 7,213,940 B1 | 5/2007 | Van De Ven |
| D546,980 S | 7/2007 | Lo |
| D553,267 S | 10/2007 | Yuen |
| 7,614,759 B2 | 11/2009 | Negley |
| 7,618,157 B1 | 11/2009 | Galvez |
| 7,663,315 B1 | 2/2010 | Hulse |
| 7,686,478 B1 | 3/2010 | Hulse |
| D629,928 S | 12/2010 | Chen et al. |
| 2002/0047516 A1 | 4/2002 | Iwasa |
| 2003/0021113 A1 | 1/2003 | Begemann |
| 2003/0038291 A1 | 2/2003 | Cao |
| 2004/0159846 A1 | 8/2004 | Doxsee |
| 2005/0174780 A1 | 8/2005 | Park |
| 2005/0242711 A1 | 11/2005 | Bloomfield |
| 2005/0276053 A1* | 12/2005 | Nortrup et al. ............ 362/294 |
| 2007/0139938 A1 | 6/2007 | Petroski |
| 2007/0206375 A1 | 9/2007 | Lys |
| 2007/0223219 A1 | 9/2007 | Medendorp |
| 2007/0263405 A1 | 11/2007 | Ng |
| 2007/0297183 A1 | 12/2007 | Coushaine |
| 2008/0037257 A1 | 2/2008 | Bolta |
| 2008/0080165 A1 | 4/2008 | Kim |
| 2008/0117620 A1 | 5/2008 | Hama et al. ............... 362/84 |
| 2008/0128735 A1 | 6/2008 | Yoo |
| 2009/0059559 A1 | 3/2009 | Pabst |
| 2009/0086492 A1 | 4/2009 | Meyer |
| 2009/0101930 A1 | 4/2009 | Li |
| 2009/0103293 A1 | 4/2009 | Harbers |
| 2009/0103296 A1 | 4/2009 | Harbers et al. |
| 2009/0116217 A1 | 5/2009 | Teng et al. |
| 2009/0201679 A1* | 8/2009 | Konaka ................ 362/235 |
| 2009/0316073 A1* | 12/2009 | Chen et al. ............... 349/64 |
| 2009/0316383 A1 | 12/2009 | Son |
| 2009/0322197 A1 | 12/2009 | Helbing |
| 2009/0322208 A1 | 12/2009 | Shaikevitch et al. ........ 313/503 |
| 2009/0323333 A1 | 12/2009 | Chang |
| 2010/0025700 A1 | 2/2010 | Jung |
| 2010/0046231 A1* | 2/2010 | Medinis ............... 362/294 |
| 2010/0134047 A1 | 6/2010 | Hasnain |
| 2010/0140655 A1 | 6/2010 | Shi ................. 257/99 |
| 2010/0149783 A1* | 6/2010 | Takenaka et al. ............ 362/84 |
| 2010/0155763 A1 | 6/2010 | Donofrio |
| 2010/0201284 A1 | 8/2010 | Kraus |
| 2010/0207502 A1 | 8/2010 | Cao et al. |
| 2010/0264799 A1 | 10/2010 | Liu et al. |
| 2010/0327745 A1 | 12/2010 | Dassanayake et al. |
| 2011/0176316 A1 | 7/2011 | Phipps et al. |

FOREIGN PATENT DOCUMENTS

| | | |
|---|---|---|
| DE | 10251955 A1 | 5/2004 |
| DE | 102004051382 | 4/2006 |
| DE | 102006061164 | 6/2008 |
| DE | 10 2007 037862 A1 | 10/2008 |
| DE | 202008013667 | 12/2008 |
| EP | 0876085 A2 | 11/1998 |
| EP | 0936682 A1 | 8/1999 |
| EP | 2146135 A2 | 1/2010 |
| EP | 2154420 | 2/2010 |
| GB | 1423011 | 1/1976 |
| GB | 2 366 610 A | 3/2002 |
| GB | 2366610 A | 3/2002 |
| JP | H03081903 | 4/1991 |
| JP | 11-213730 A | 8/1999 |
| JP | 2003515899 | 5/2003 |
| JP | 2005-093097 A | 4/2005 |
| JP | 2005-286267 A | 10/2005 |
| JP | 2005021635 | 11/2005 |
| JP | 200640850 A | 9/2006 |
| JP | 2006525648 | 11/2006 |
| JP | 2006331683 | 12/2006 |
| JP | 2008505448 | 2/2008 |
| JP | 2008300117 | 12/2008 |
| JP | 2009-016058 A | 1/2009 |
| KR | 100980588 B1 | 9/2010 |
| KR | 3020110008445 | 3/2011 |
| TW | D134005 | 3/2010 |
| TW | 100300960 | 3/2011 |
| TW | D141681 | 7/2011 |
| WO | WO 00/17569 A1 | 3/2000 |
| WO | WO 01/40702 A1 | 6/2001 |
| WO | WO2004100213 A2 | 5/2004 |
| WO | WO2005107420 A2 | 11/2005 |
| WO | WO 2007/130358 A2 | 11/2007 |
| WO | WO2007146566 A2 | 12/2007 |
| WO | WO 2008/018002 A2 | 2/2008 |
| WO | WO2008134056 A1 | 4/2008 |
| WO | WO 2008/052318 A1 | 5/2008 |
| WO | WO 2008/117211 A1 | 10/2008 |
| WO | WO 2008/146229 A2 | 12/2008 |
| WO | WO 2009/024952 A2 | 2/2009 |
| WO | 2009052099 | 4/2009 |
| WO | WO 2009/091562 A2 | 7/2009 |
| WO | WO 2009/093163 A2 | 7/2009 |
| WO | WO2009093163 A2 | 7/2009 |
| WO | WO 2009/107052 A1 | 9/2009 |
| WO | WO 2009/119038 A2 | 10/2009 |
| WO | WO 2009/128004 A1 | 10/2009 |
| WO | WO2009125314 A2 | 10/2009 |
| WO | WO2009143047 A2 | 11/2009 |
| WO | WO 2009/158422 A1 | 12/2009 |
| WO | WO2009158422 A1 | 12/2009 |
| WO | WO 2010/012999 A2 | 2/2010 |
| WO | WO2010052640 | 5/2010 |
| WO | WO 2010/119618 A1 | 10/2010 |
| WO | WO 2010/128419 A1 | 11/2010 |
| WO | WO2011109091 A1 | 9/2011 |

OTHER PUBLICATIONS

International Search Report and Written Opinion for PCT/US2011/000407 mailed Nov. 16, 2011.
Office Action of the IPO for Taiwan Patent Application No. TW 100300962 issued Nov. 21, 2011.
Office Action of the IPO for Taiwan Patent Application No. TW 100300961 issued Nov. 16, 2011.
Office Action of the IPO for Taiwan Patent Application No. TW 100300960 issued Nov. 15, 2011.
Office Action of the IPO for Taiwan Patent Application No. TW 100302770 issued Jan. 13, 2012.
International Search Report and Written Opinion, PCT/US2009/063804, Mailed on Feb. 26, 2010.
U.S. Appl. No. 12/566,195, Van De Ven, filed Sep. 24, 2009.
U.S. Appl. No. 12/704,730, Van De Ven, filed Feb. 12, 2010.
C.Crane Geobulb®—II LED Light Bulb, Item #2sw, Description, p. 1-2.
C.Crane Geobulb®—II LED Light Bulb, Item #2sw, Specs, p. 1-2.
Cree LR4, 4" Recessed Architectural Downlight, Product Info p. 1-2.
Cree LR6, 6" Recessed Downlight Module, Product Info, p. 1-2.
U.S. Appl. No. 12/901,405, filed Oct. 8, 2010, Tong.
U.S. Appl. No. 61/339,515, filed Mar. 3, 2010, Tong.
U.S. Appl. No. 12/848,825, filed Aug. 2, 2010, Tong.
U.S. Appl. No. 12/975,820, Van De Ven.
U.S. Appl. No. 13/029,063, filed Feb. 16, 2011, Hussell.
U.S. Appl. No. 61/424,670, filed Dec. 19, 2010, Zongjie Yuan.
Cree, XLamp® LEDs, Data Sheet, Dated 1996-2010.
Nichia Corp Part Spec, *High Brightness LEDs*, (May 1999), p. 1-3, (NSPW 300BS, NSPW 312BS, Etc.).
U.S. Appl. No. 11/656,759, filed Jan. 22, 2007, Chitnis.
U.S. Appl. No. 11/899,790, filed Sep. 7, 2007, Chitnis.
U.S. Appl. No. 11/473,089, filed Jun. 21, 2006, Tarsa.

(56) References Cited

OTHER PUBLICATIONS

U.S. Appl. No. 61/435,759, filed Jan. 24, 2011, Le.
U.S. Appl. No. 61/339,516, filed Mar. 3, 2010, Tong.
International Search Report and Written Opinion for counterpart PCT Application No. PCT/US2011/000400 mailed May 2, 2011.
Notice to Submit a Response from Korean Patent Application No. 30-2011-0008448. dated Apr. 16, 2012.
Notice to Submit a Response from Korean Patent Application No. 30-2011-0008445. dated Apr. 16, 2012.
Notice to Submit a Response from Korean Patent Application No. 30-2011-0008446. dated Apr. 16, 2012.
Office Action for Taiwanese Patent Application No. 100300961. dated May 7, 2012.
Office Action from Taiwanese Patent Application No. 100300960. dated May 7, 2012.
International Search Report and Written Opinion for PCT Application No. PCT/US2011/000397 mailed May 24, 2011.
International Search Report and Written Opinion for PCT Application No. PCT/US2010/003146 mailed Jun. 7, 2011.
Decision for Final Rejection for Japanese Patent Application No. 2001-542133 mailed Jun. 28, 2011.
International Search Report and Written Opinion for PCT Application No. PCT/US2011/000399 mailed Jul. 12, 2011.
Decision to Refuse a European Patent Application for EP 09 152 962.8 dated Jul. 6, 2011.
International Search Report and Written Opinion for PCT/US2011/000403 mailed Aug. 23, 2011.
International Search Report and Written Opinion for PCT/US2011/000404 mailed Aug. 25, 2011.
International Search Report and Written Opinion for PCT/US2011/000398 mailed Aug. 30, 2011.
International Search Report and Written Opinion for PCT/US2011/000406 mailed Sep. 15, 2011.
Notice to Submit a Response from Korean Design Patent Application No. 30-2011-0024961, dated Sep. 10, 2012.
International Search Report and Written Opinion for PCT Application No. PCT/US2011/000391 mailed Oct. 6, 2011.
International Search Report and Written Opinion for PCT Application No. PCT/US2011/000402 mailed Sep. 30, 2011.
International Search Report and Written Opinion from PCT Application No. PCT/US2012/044705 dated Oct. 9, 2012.
Notice to Submit a Response from Korean Patent Application No. 30-2011-0008446. dated Oct. 22, 2012.
Search Report and Written Opinion from PCT Application No. PCT/US2012/072108. dated Feb. 27, 2013.
International Search Report and Written Opinion from PCT Application No. PCT/US2011/000389, dated May 6, 2013.
International Search Report and Written Opinion from PCT Application No. PCT/US2011/000390, dated May 6, 2013.
International Preliminary Report on Patentability from PCT/US2011/00389, dated May 8, 2013.
International Preliminary Report on Patentability from PCT/US2011/000390, dated May 8, 2013.
Reasons for Rejection from Japanese Patent Appl. No. 2011-198454. dated Mar. 7. 2013.
Office Action from U.S. Appl. No. 13/029,025, dated Jul. 16, 2013.
Notice of Reasons for Rejection from Japanese Patent Appl. No. 2012-543086, dated Aug. 27, 2013.

* cited by examiner

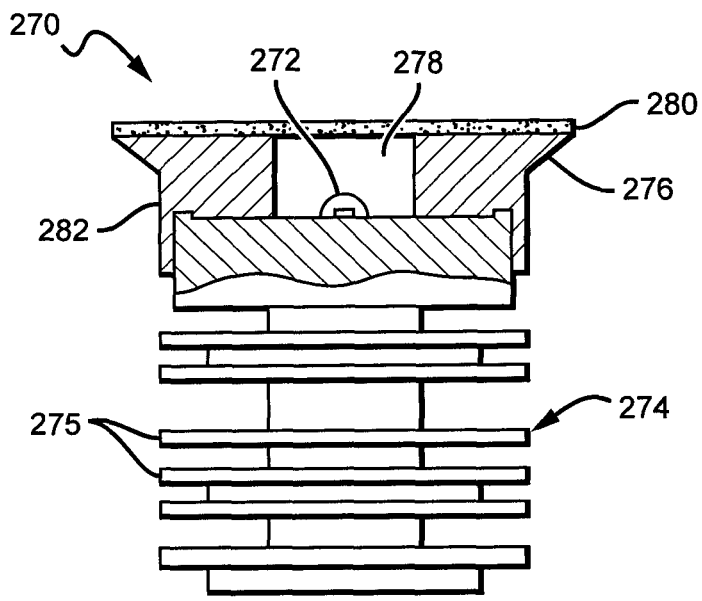
FIG. 15
FIG. 16
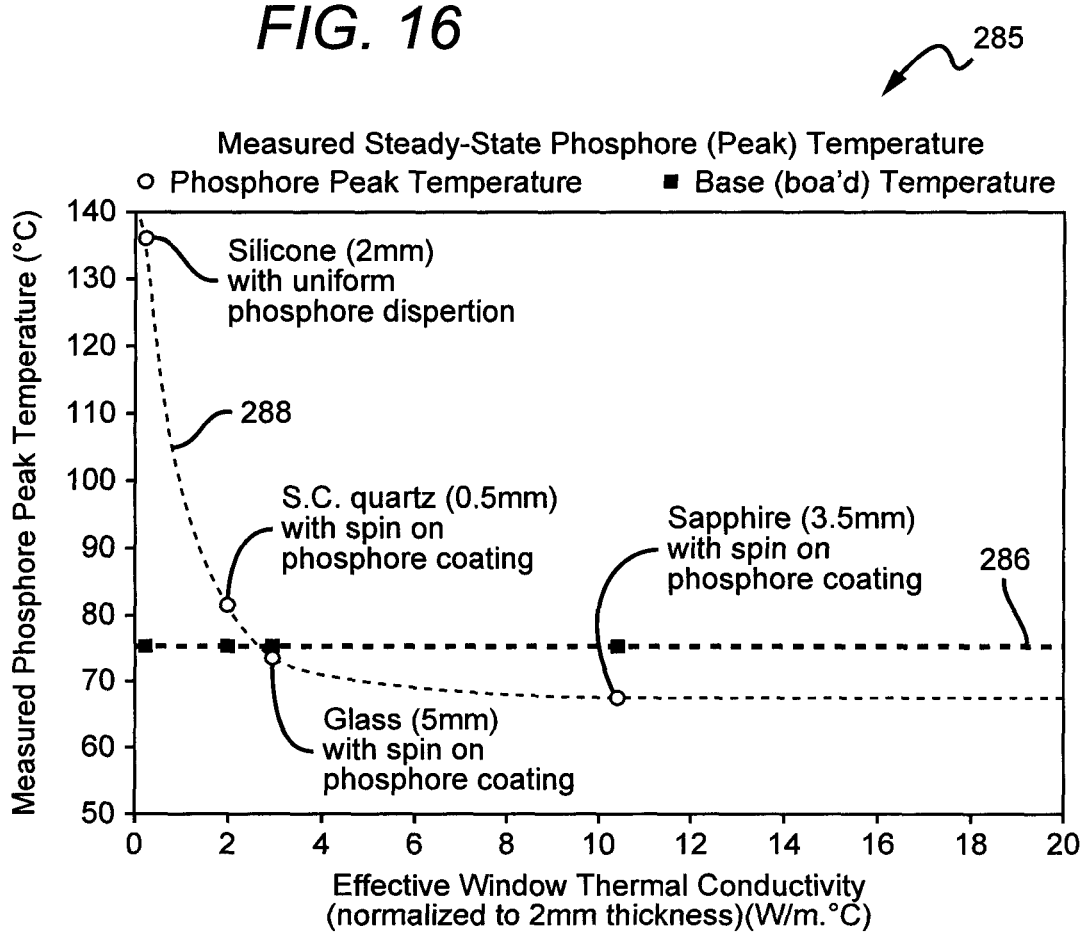

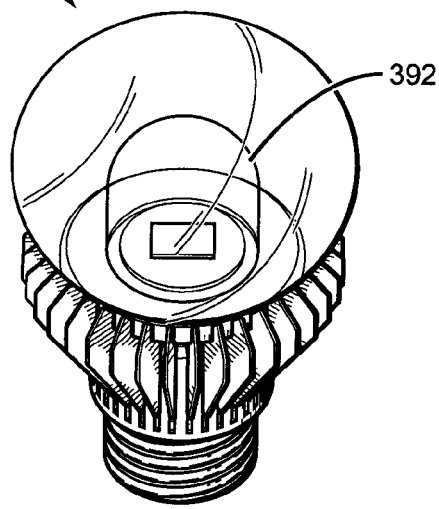
FIG. 29
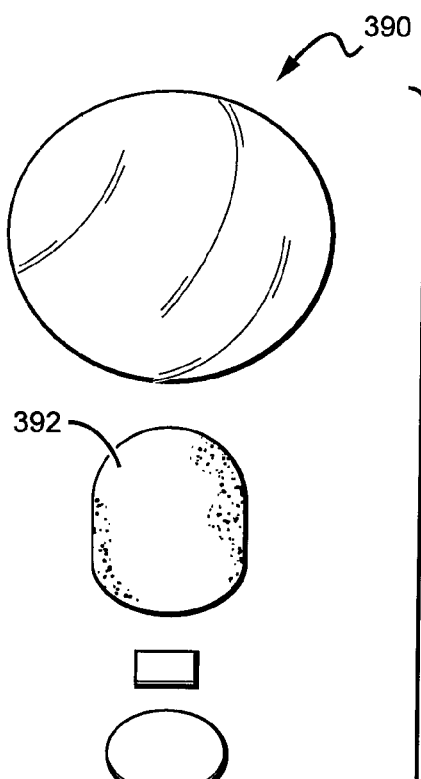
FIG. 31
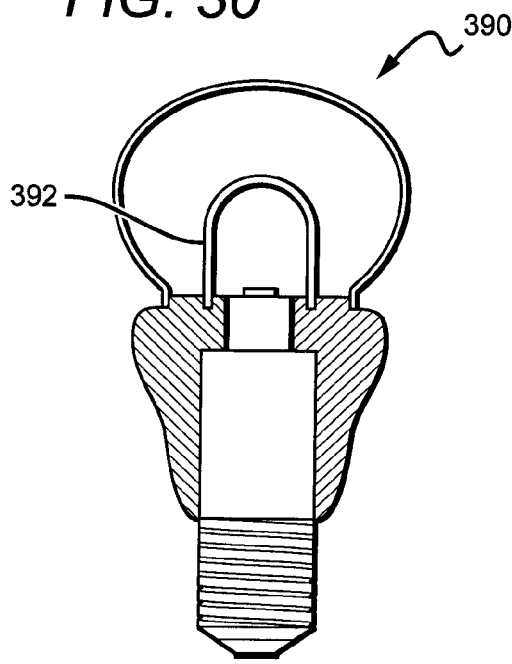
FIG. 30
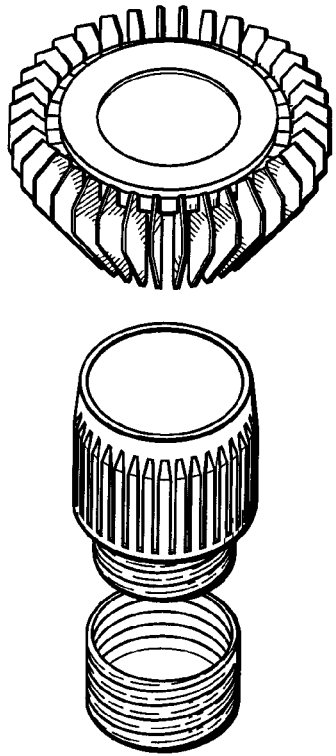

LED LAMP INCORPORATING REMOTE PHOSPHOR AND DIFFUSER WITH HEAT DISSIPATION FEATURES

This application claims the benefit of U.S. Provisional Patent Application Ser. No. 61/339,516, filed on Mar. 3, 2010, U.S. Provisional Patent Application Ser. No. 61/339,515, filed on Mar. 3, 2010, U.S. Provisional Patent Application Ser. No. 61/366,437, filed on Sep. 24, 2010, U.S. Provisional Application Ser. No. 61/424,665, filed on Dec. 19, 2010, U.S. Provisional Application Ser. No. 61/424,670, filed on Dec. 19, 2010, U.S. Provisional Patent Application Ser. No. 61/434,355, filed on Jan. 19, 2011, U.S. Provisional Patent Application Ser. No. 61/435,326, filed on Jan. 23, 2011, and U.S. Provisional Patent Application Ser. No. 61/435,759, filed on Jan. 24, 2011. This application is also a continuation-in-part from, and claims the benefit of, U.S. patent application Ser. No. 12/848,825, filed on Aug. 2, 2010.

BACKGROUND OF THE INVENTION

1. Field of the Invention

This invention relates to solid state lamps and bulbs and in particular to efficient and reliable light emitting diode (LED) based lamps and bulbs comprising remote phosphors with heat dissipation features.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflective cup due to the less than 100% reflectivity of practical reflector surfaces). In addition, heat retention may be an issue for a package such as the package 10 shown in FIG. 1, since it may be difficult to extract heat through the leads 15A, 15B.

A conventional LED package 20 illustrated in FIG. 2 may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 27 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

LED chips, such as those found in the LED package 20 of FIG. 2 can be coated by conversion material comprising one or more phosphors, with the phosphors absorbing at least some of the LED light. The conversion material can emit a different wavelength of light such that LED package emits a combination of light from the LED chip and the phosphor. The LED chip(s) can be coated with a phosphor using many different methods, with one suitable method being described in U.S. patent application Ser. Nos. 11/656,759 and 11/899,790, both to Chitnis et al. and both entitled "Wafer Level Phosphor Coating Method and Devices Fabricated Utilizing Method". Alternatively, the LEDs can be coated using other methods such as electrophoretic deposition (EPD), with a suitable EPD method described in U.S. patent application Ser. No. 11/473,089 to Tarsa et al. entitled "Close Loop Electrophoretic Deposition of Semiconductor Devices".

These types of LED chips have been used in different lamps, but experience some limitations based on the structure of the devices. The phosphor material is on or in close proximity to the LED epitaxial layers and in some instances comprises a conformal coat over the LED. In these arrangements, the phosphor material is subjected to direct chip heating due to the lack of a heat dissipation path except through the chip itself. As a result the phosphor material can operate at a temperature higher than the LED chip. This elevated operating temperature can cause degradation of the phosphor material, the binding material, and/or the encapsulant material over time. It can also cause a reduction in phosphor conversion efficiency and consequently often a shift in the perceived color of the LED light.

Lamps have also been developed utilizing solid state light sources, such as LEDs, with a conversion material that is separated from or remote to the LEDs. Such arrangements are disclosed in U.S. Pat. No. 6,350,041 to Tarsa et al., entitled "High Output Radial Dispersing Lamp Using a Solid State Light Source." The lamps described in this patent can comprise a solid state light source that transmits light through a separator to a disperser having a phosphor. The disperser can disperse the light in a desired pattern and/or changes its color by converting at least some of the light through a phosphor. In some embodiments the separator spaces the light source a sufficient distance from the disperser such that heat from the light source will not transfer to the disperser when the light source is carrying elevated currents necessary for room illumination. Additional remote phosphor techniques are described in U.S. Pat. No. 7,614,759 to Negley et al., entitled "Lighting Device."

Phosphors, however, generate heat during the light conversion process and this phosphor conversion heating can account for 20-30% of the total heat generation in an LED package. In applications where the phosphor is located in close proximity to the chip (e.g., conformally coated onto the chip), the high local density of excitation photons emerging from the chip surface can lead to very high local heating and hence high peak temperatures in the phosphor layer. In many remote phosphor applications, this photon density is spread out over a larger phosphor area, generally leading to reduced local temperatures. However, in many remote phosphor arrangements the heat from phosphor conversion heating generally has inadequate heat dissipation paths to dissipate the phosphor conversion heat. Without an effective heat dissipation pathway, thermally isolated remote phosphors may suffer from elevated operating temperatures that in some instances can be even higher than the temperature in comparable conformal coated layers. This can lead to degradation, conversion inefficiency and color shifting, some of which was meant to be avoided by having a remote phosphor.

SUMMARY OF THE INVENTION

The present invention provides various embodiments of lamps and bulbs that are efficient, reliable and cost effective. The different embodiments can be arranged with remote conversion material, which helps reduce or eliminate the spread of heat from the light emitters to the phosphor material. The lamps and bulbs can also comprise thermal management features that allow for efficient conduction of conversion generated heat away from the remote conversion material. This reduces or eliminates the negative impact that elevated temperature can have on efficiency and reliability of the conversion material. In different embodiments that conversion material can comprise a phosphor carrier that can be 2-dimensional or 3-dimensional shaped. The different embodiments can be arranged to fit recognized standard size profiles, and can comprise various arrangements having a conversion material positioned remote to the lamp light source. The different embodiments can also be arranged with features to promote uniform lamp or bulb color and intensity emission.

One embodiment of a lamp according to the present invention comprises a light source and a phosphor carrier remote to the light source. The phosphor carrier can comprise a thermally conductive material that is at least partially transparent to light from the light source, and a conversion material that absorbs light from the light source and emits a different wavelength of light. A heat sink structure is included with the phosphor carrier thermally coupled to the heat sink structure.

One embodiment of an LED based lamp according to the present invention comprises an LED light source and a phosphor arranged remote to the light source. Light emitted from the light source passes through the phosphor and at least some of light is converted by the phosphor. The lamp further comprises a thermally conductive path to conduct phosphor conversion heat away from the phosphor and to dissipate the heat.

Another embodiment of a lamp according to the present invention comprises a heat sink structure and an LED based light source. A conversion material is arranged remote to the light source and arranged to absorb light from the light source and re-emit light of a different wavelength. A first thermally conductive path is included to conduct conversion heat away from the conversion material to the heat sink.

These and other aspects and advantages of the invention will become apparent from the following detailed description and the accompanying drawings which illustrate by way of example the features of the invention.

BRIEF DESCRIPTION OF THE DRAWINGS

FIG. 15 is a side view of another embodiment of a lamp according to the present invention;

FIG. 16 is a graph showing steady state operating temperatures for one embodiment of a lamp according to the present invention;

FIG. 29 is a perspective view of another embodiment of a lamp according to the present invention with a diffuser dome having a different shape;

FIG. 30 is a sectional view of the lamp shown in FIG. 29;

FIG. 31 is an exploded view of the lamp shown in FIG. 29;

DETAILED DESCRIPTION OF THE INVENTION

The present invention is directed to different embodiments of lamp or bulb structures comprising a remote conversion material that can be arranged so that less heat from the emitters heats the conversion material, with the remote conversion material also capable of being operated without the substantial build-up of heat in the conversion material due to the light conversion process. This reduces or eliminates the negative impact that elevated temperature can have on efficiency and reliability of the conversion material. The present invention is also directed to lamps comprising features that mask the conversion material from the view by the lamp user, and can also disperse or redistribute the light from the remote conversion material and/or the lamp's light source into a desired emission pattern.

Figure 1:
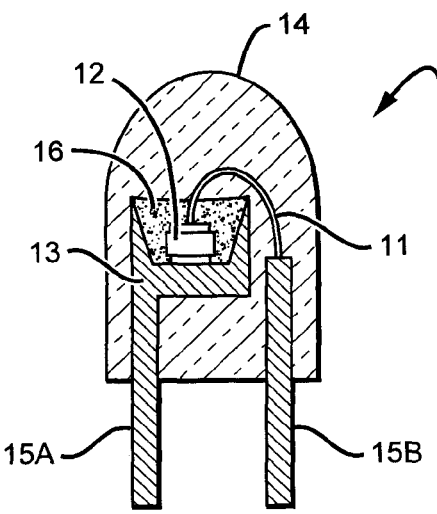
FIG. 1 shows a sectional view of one embodiment of a prior art LED lamp.
Figure 2:
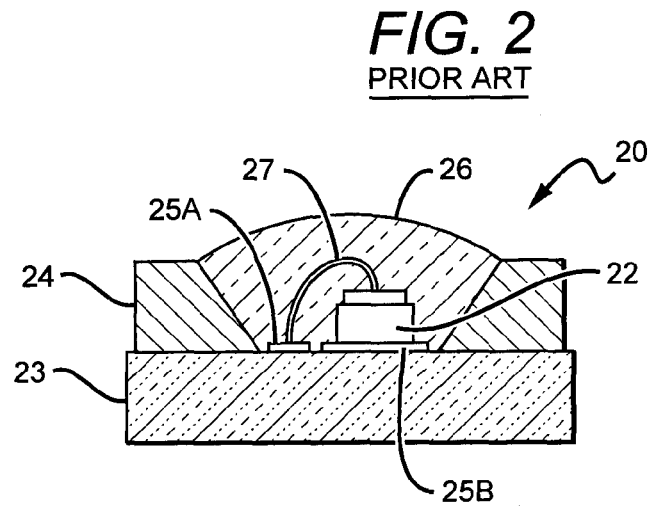
FIG. 2 shows a sectional view of another embodiment of a prior art LED lamp.
Figure 3:
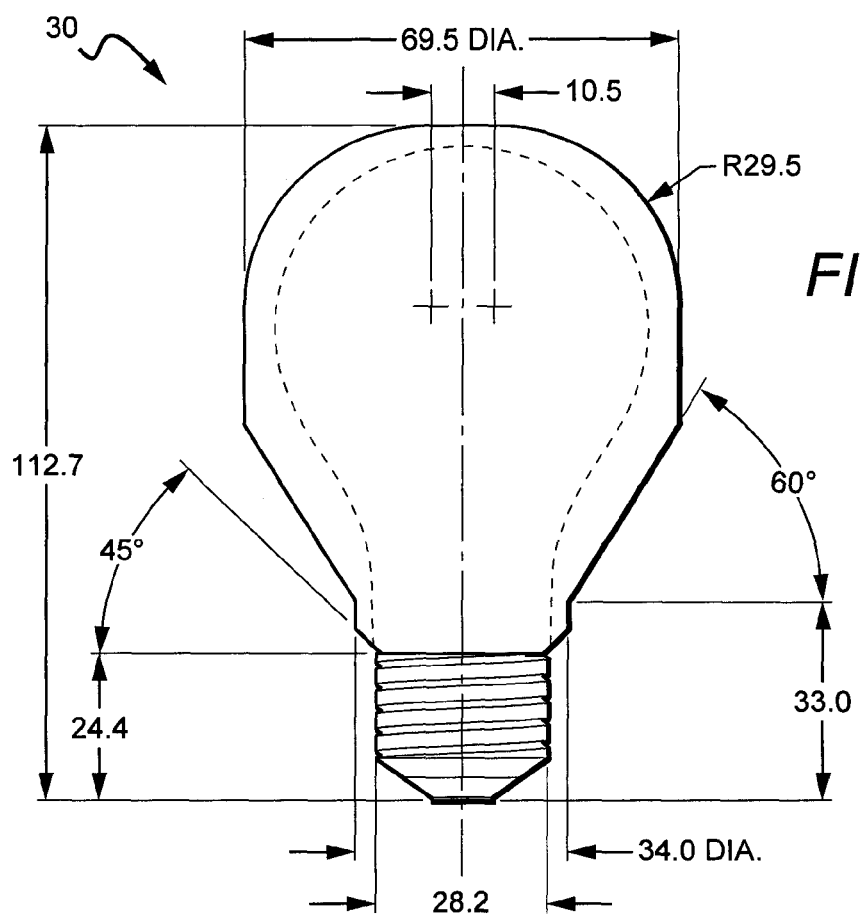
FIG. 3 shows the size specifications for an A19 replacement bulb.

Different embodiments of the lamps can have many different shapes and sizes, with some embodiments having dimensions to fit into standard size envelopes, such as the A19 size envelope 30 as shown in FIG. 3. This makes the lamps particularly useful as replacements for conventional incandescent and fluorescent lamps or bulbs, with lamps according to the present invention experiencing the reduced energy consumption and long life provided from their solid state light sources. The lamps according to the present invention can also fit other types of standard size profiles including but not limited to A21 and A23.

In different lamp embodiments the conversion material can comprise one or multiple conversion materials, such as phosphors. Thermal paths can be included for heat to dissipate from the conversion material during operation while at the same time keeping the conversion material remote to the light source so that most or all of the heat from the light source does not pass into the conversion material and the local density of excitation photons incident of the phosphor layer is reduced. This allows the remote conversion material to operate with a lower temperature and reduced photon excitation density compared to conversion materials lacking thermally conductive paths to dissipate conversion heat.

By being remote and remaining relatively cool, the conversion material can operate more efficiently and does not suffer the heat related color shift. Operating at lower temperature also reduces heat related degradation of the conversion material and can increase the long term reliability of the conversion material. The different remote arrangements according to the present invention can also allow the conversion material to operate with lower excitation density which can reduce the likelihood that the phosphor will be optically saturated by incident light from the light source.

In some lamp embodiments according to the present invention, the conversion material can comprise a phosphor carrier that includes one or more phosphors arranged on or integral to a carrier layer or material. The carrier layer can comprise many different thermally conductive materials that are substantially transparent to the desired wavelengths of light, such as the light emitted by the lamp's light emitters. In some embodiments the phosphor carrier can be provided with a means for dissipating the build-up of conversion heating and in one embodiment the phosphor carrier is in good thermal contact with a heat sink structure. The phosphor carrier can be mounted to the heat sink with thermal contact at the edges of the phosphor carrier. A light source can be mounted in the lamp, such as in or on the heat sink structure, at a location so that there is separation between the light source and the phosphor carrier; i.e. the phosphor carrier and its phosphor are remote from the light source.

The light source is also arranged so that at least some of its emitted light passes through the phosphor carrier and its phosphor, with at least some of the light from the light source converted by the phosphor. In some embodiments this conversion can comprise photon down conversion wherein the wavelength of the converted light is longer than the light source light. In other embodiments this conversion can comprise up conversion wherein the wavelength of the converted light is shorter than the light source light. In either case, the conversion can cause heat to be generated in the phosphor from the conversion process. The phosphor conversion heat can be conducted through the thermally conductive carrier layer and into the heat sink structure where it can dissipate into the ambient. In some embodiments, the carrier layer can collect the heat generated from the phosphor layer, spreads it laterally, and conducts the heat to the heat sink structure. The heat sink structure can be arranged with different features that help dissipate the heat to the ambient, and this thermal management arrangement allows the remote phosphor layer to maintain a lower operating temperature leading to the benefits mentioned above.

As further described below, the lamps according to the present invention can be arranged in many different ways. In some embodiments the light sources can comprise solid state light sources, such as different types of LEDs, LED chips or LED packages with different lens or optic arrangements. In other embodiments a single LED chip or package can be used, while in others multiple LED chips or packages can be used and arranged in different types of arrays. By having the phosphor thermally isolated or not in direct thermal contact from LED chips and with good thermal dissipation, the LED chips can be driven by higher current levels without causing detrimental effects to the conversion efficiency of the phosphor and its long term reliability. This can allow for the flexibility to overdrive the LED chips so that a lower number of LEDs can be used to produce the desired luminous flux, which in turn can reduce the cost and/or the complexity of the lamps. These LED packages can also comprise LEDs encapsulated with a material that can withstand the elevated luminous flux or can comprise unencapsulated LEDs.

In some embodiments the light source can comprise one or more blue emitting LEDs and the phosphor in the phosphor carrier can comprise one or more materials that absorb a portion of the blue light and emit one or more different wavelengths of light such that the lamp emits a white light combination from the blue LED and the conversion material. The conversion material can absorb the blue LED light and emit different colors of light including but not limited to yellow and green. The light source can also comprise different LEDs and conversion materials emitting different colors of light so that the lamp emits light with the desired characteristics such as color temperature and color rendering.

For some applications, it may be desirable (in order to meet specific requirements of color point/color temperature and/or color rendering) to have some portion of the light emitted by the light source and/or phosphor layer comprise essentially red light. Conventional lamps incorporating both red and blue LED chips can be subject to color instability with different operating temperatures and dimming. This can be due to the different behaviors of red and blue LEDs at different temperature and operating power (current/voltage), as well as different operating characteristics over time. This effect can be mitigated somewhat through the implementation of an active control system that can add cost and complexity to the overall lamp. Different embodiments according to the present invention can address this issue by having a light source with the same type of emitters in combination with a remote phosphor that can comprise multiple types or layers and/or regions of phosphors that remain relatively cool through the thermal dissipation arrangements disclosed herein. The remote phosphor carrier can absorb light from the emitters and can re-emit different colors of light, including red light, while still experiencing the efficiency and reliability of reduced operating temperature for the phosphors.

The separation of the phosphor elements from the LEDs provides the added advantage of easier and more consistent color binning. This can be achieved in a number of ways. LEDs from various bins (e.g. blue LEDs from various bins) can be assembled together to achieve substantially wavelength uniform excitation sources that can be used in different lamps. These can then be combined with phosphor carriers having substantially the same conversion characteristics to provide lamps emitting light within the desired bin. In addition, numerous phosphor carriers can be manufactured and pre-binned according to their different conversion characteristics. Different phosphor carriers can be combined with light sources emitting different characteristics to provide a lamp emitting light within a target color bin.

The heat sink structure can comprise different structures and materials in different embodiments according to the present invention. In some embodiments it can comprise a thermally conductive material having heat dissipating features such as fins or heat pipes. In still other embodiments the heat sink structure can comprise different types of lamp collars that can be mounted to a different feature such as a separate heat sink. Different phosphor carriers according to the present invention can be arranged in different ways, such as with phosphor layers arranged on different surfaces of a carrier layer, phosphor regions patterned on a surface(s) of a carrier layer, or phosphor regions either uniformly or non-uniformly distributed across or throughout the carrier layer. The phosphor carrier can also include other materials such as scattering particles, while in other embodiments the phosphor carrier can comprise more than one phosphor material.

The lamps according to the present invention can also provide for improved emission efficiency by surrounding the light source with a reflective surface. This can result in enhanced photon recycling by reflecting much of the light re-emitted from the conversion material back toward the light source. To further enhance efficiency and to provide the desired emission profile, the surfaces of the phosphor layer, carrier layer or diffuser can be smooth or scattering. In some embodiments, the internal surfaces of the carrier layer and diffuser can be optically smooth to promote total internal reflecting behavior that reduces the amount of light directed backward from the phosphor layer (either downconverted light or scattered light). Correspondingly, in some cases one or more external surfaces of the carrier layer or phosphor layer may be roughened or otherwise modified to promote light emission from this external surface. Further, the combination of one or more roughened external surfaces with smooth internal surfaces may be used to promote light emission through the carrier and phosphor layer in preferred directions. Properties such as surface roughness, reflectivity, and index of refraction of the carrier layer and phosphor layer may in general be used to guide or direct the light emitted by or transferred through the carrier/phosphor layer into preferred directions, for example to provide improved efficiency by reducing the amount of backward emitted light that can be absorbed by the lamp's LED chips, associated substrate, or other non-ideal reflecting surfaces within the interior of the lamp, improving beam intensity profiles and color uniformity, etc.

The phosphor layer and/or carrier layer may comprise either essentially two-dimensional or three-dimensional geometries. Two-dimensional geometries such as a planar or disk-shaped profile may facilitate fabrication and application of the phosphor layer and reduce manufacturing costs. Three-dimensional (e.g., essentially spherical, conic, tubular, rectangular, etc. shapes) may facilitate the distribution of light into specific directions, for example, to achieve a specific resulting beam intensity profile or uniformity as a function of viewing angle.

The present invention is described herein with reference to certain embodiments, but it is understood that the invention can be embodied in many different forms and should not be construed as limited to the embodiments set forth herein. In particular, the present invention is described below in regards to certain lamps having LEDs or LED chips or LED packages in different configurations, but it is understood that the present invention can be used for many other lamps having many different array configurations. Examples of different lamps arranged in different ways according to the present invention are described below and in U.S. Provisional Patent application Ser. No. 61/435,759, to Le et al., entitled "Solid State Lamp", filed on Jan. 24, 2011, and incorporated herein by reference.

The embodiments below are described with reference to LED or LEDs, but it is understood that this is meant to encompass LED chips and LED packages. The components can have different shapes and sizes beyond those shown and different numbers of LEDs can be included. It is also understood that the embodiments described below can use co-planar light sources, but it is understood that non co-planar light sources can also be used.

The present invention is described herein with reference to conversion materials, phosphor layers and phosphor carriers, all being "remote" to said light source or LED. Remote in this context refers being spaced apart from and/or not being on or in direct thermal contact.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 4:
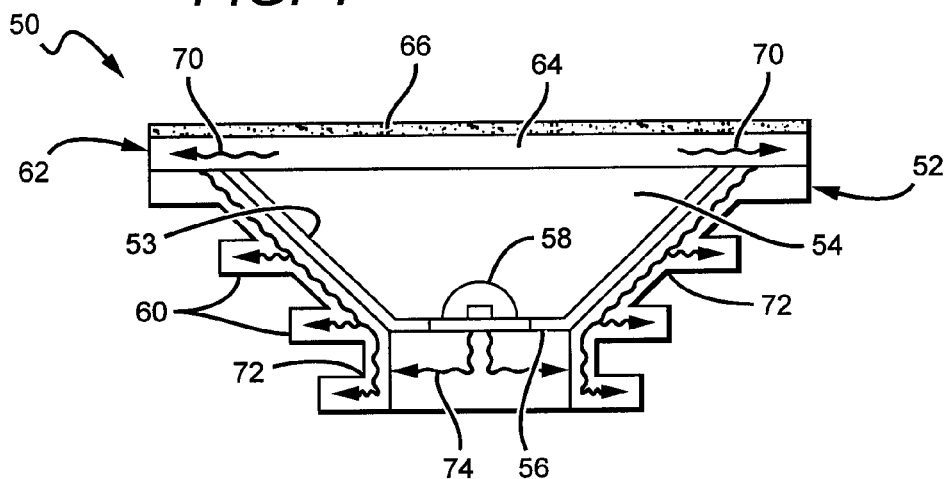
FIG. 4 is a sectional view of one embodiment of a lamp according to the present invention.

FIG. 4 shows one embodiment of a lamp 50 according to the present invention that comprises a heat sink structure 52 having an optical cavity 54 with a platform 56 for holding a light source 58. Although this embodiment and some embodiments below are described with reference to an optical cavity, it is understood that many other embodiments can be provided without optical cavities. These can include, but are not limited to, light sources being on a planar surface or on a pedestal. The light source 58 can comprise many different emitters with the embodiment shown comprising an LED, which can comprise many different commercially available LED chips or LED packages including, but not limited to, those commercially available from Cree, Inc. located in Durham, N.C. The light source 58 can be mounted to the platform 56 using many different known mounting methods and materials with light from the light source 58 emitting out the top opening of the cavity 54. In some embodiments light source 58 can be mounted directly to the platform 56, while in other embodiments the light source can be included on a submount or printed circuit board (PCB) that is then mounted to the platform 56. The platform 56 and the heat sink structure 52 can comprise electrically conductive paths for applying an electrical signal to the light source 58, with some of the conductive paths being conductive traces or wires. All or portions of the platform 56 can also be made of a thermally conductive material and the thermally conductive material can be thermally coupled to or integral to the heat sink structure 52.

In some embodiments the lamp's light source can be provided as an array of emitters that are co-planar, with the emitters being mounted on a flat or planar surface. Co-planar light sources can reduce the complexity of the emitter arrangements, making them both easier and cheaper to manufacture. Co-planar light sources, however, tend to emit primarily in the forward direction such as in a Lambertian emission pattern. In different embodiments it can be desirable to emit a light pattern mimicking that of conventional incandescent light bulbs that can provide nearly uniform emission intensity and color uniformity at different emission angles. Different embodiments of the present invention are arranged with a diffuser as described below that can achieve this uniform or essentially isotropic lamp emission pattern when using a planar light source emitting an emission pattern such as Lambertian.

The heat sink structure 52 can at least partially comprise a thermally conductive material, and many different thermally conductive materials can be used including different metals such as copper or aluminum, or metal alloys. In some embodiments the heat sink can comprise high purity aluminum that can have a thermal conductivity at room temperature of approximately 210 W/m-k). In other embodiments the heat sink structure can comprise die cast aluminum having a thermal conductivity of approximately 200 W/m-k. The heat sink structure 52 can also comprise other heat dissipation features such as heat fins 60 that increase the surface area of the heat sink to facilitate more efficient heat dissipation into the ambient. In some embodiments, the heat fins 60 can be made of material with higher thermal conductivity than the remainder of the heat sink. In the embodiment shown the fins 60 are shown in a generally horizontal orientation, but it is understood that in other embodiments the fins can have a vertical or angled orientation. In still other embodiments, the heat sink can comprise active cooling elements, such as fans, to lower the convective thermal resistance within the lamp. In some embodiments, heat dissipation from the phosphor carrier is achieved through a combination of convection thermal dissipation and conduction through the heat sink structure 52.

Reflective layers 53 can also be included on the heat sink structure 52, such as on the surface of the optical cavity 54. In some embodiments the surfaces can be coated with a material having a reflectivity of approximately 75% or more to the visible wavelengths of light emitted by the light source 58 and/or a wavelength conversion material ("the lamp light"), while in other embodiments the material can have a reflectivity of approximately 85% or more to the lamp light. In still other embodiments the material can have a reflectivity to the lamp light of approximately 95% or more.

The heat sink structure 52 can also comprise features for connecting to a source of electricity such as to different electrical receptacles. In some embodiments the heat sink structure can comprise a feature of the type to fit in conventional electrical receptacles. For example, it can include a feature for mounting to a standard Edison socket, which can comprise a screw-threaded portion which can be screwed into an Edison socket. In other embodiments, it can include a standard plug and the electrical receptacle can be a standard outlet, or can comprise a GU24 base unit, or it can be a clip and the electrical receptacle can be a receptacle which receives and retains the clip (e.g., as used in many fluorescent lights). These are only a few of the options for heat sink structures and receptacles, and other arrangements can also be used that safely deliver electricity from the receptacle to the lamp 50. The lamps according to the present invention can comprise a power conversion unit that can comprise a driver to allow the bulb to run from an AC line voltage/current and to provide light source dimming capabilities. In some embodiments, the power supply can comprise an offline constant-current LED driver using a non-isolated quasi-resonant flyback topology. The LED driver can fit within the lamp and in some embodiments can comprise a less than 25 cubic centimeter volume, while in other embodiments it can comprise an approximately 20 cubic centimeter volume. In some embodiments the power supply can be non-dimmable but is low cost. It is understood that the power supply used can have different topology or geometry and can be dimmable as well.

A phosphor carrier 62 is included over the top opening of the cavity 54 and in the embodiment shown it covers the entire opening. The cavity opening is shown as circular and the phosphor carrier 62 is a circular disk, but it is understood that the cavity opening and the phosphor carrier can be many different shapes and sizes. It is also understood that the phosphor carrier 62 can cover less than all of the cavity opening. Phosphor carriers according to the present invention can be characterized as comprising a conversion material and thermally conductive light transmitting material. The light transmitting material can be transparent to the light emitted from the light source 58 and the conversion material should be of the type that absorbs the wavelength of light from the light source and re-emits a different wavelength of light. In the embodiment shown, the thermally conductive light transmitting material comprises a carrier layer 64 and the conversion material comprises a phosphor layer 66 on the carrier layer 64. As further described below, different embodiments can comprise many different arrangements of a carrier layer and phosphor layer.

When light from the light source 58 is absorbed by the phosphor in the phosphor layer 66 it is re-emitted in isotropic directions with approximately 50% of the light emitting forward and 50% emitting backward into the cavity 54. In prior LEDs having conformal phosphor layers, a significant portion of the light emitted backwards can be directed back into the LED and its likelihood of escaping is limited by the extraction efficiency of the LED structure. For some LEDs the extraction efficiency can be approximately 70%, so a percentage of the light directed from the conversion material back into the LED can be lost. In lamps according to the present invention having a remote phosphor configuration, with LEDs on the platform 56 at the bottom of the cavity 54, a higher percentage of the backward emitted phosphor light strikes a surface of the cavity instead of the LED. Coating these surfaces with reflective layer 53 increases the percentage of light that reflects back into the phosphor layer 66 where it can emit from the lamp. These reflective layers 53 allow for the optical cavity to effectively recycle photons, and increase the emission efficiency of the lamp. It is understood that the reflective layer can comprise many different materials and structures including but not limited to reflective metals or multiple layer reflective structures such as distributed Bragg reflectors. Reflective layers can also be included in embodiments not having an optical cavity. In embodiments having LEDs mounted on a planar surface or on a pedestal, reflective layers can also be included around the LEDs to increase efficiency in much the same way as the reflective layers in the embodiments with optical cavities.

The carrier layer 64 can be made of many different materials having a thermal conductivity of 0.5 W/m-k or more, such as quartz, silicon carbide (SiC) (thermal conductivity ~120 W/m-k), glass (thermal conductivity of 1.0-1.4 W/m-k) or sapphire (thermal conductivity of ~40 W/m-k). The phosphor carrier can also have different thicknesses depending on the material being used, with a suitable range of thicknesses being 0.1 mm to 10 mm or more. It is understood that other thicknesses can also be used depending on the characteristics of the material for the carrier layer. The material should be thick enough to provide sufficient lateral heat spreading for the particular operating conditions. Generally, the higher the thermal conductivity of the material, the thinner the material can be while still providing the necessary thermal dissipation. Different factors can impact which carrier layer material is used including but not limited to cost and transparency to the light source light. Some materials may also be more suitable for larger diameters, such as glass or quartz. These can provide reduced manufacturing costs by formation of the phosphor layer on the larger diameter carrier layers and then singulation into the smaller carrier layers.

Many different phosphors can be used in the phosphor layer 66 with the present invention being particularly adapted to lamps emitting white light. As described above, in some embodiments the light source 58 can be LED based and can emit light in the blue wavelength spectrum. The phosphor layer can absorb some of the blue light and re-emit yellow. This allows the lamp to emit a white light combination of blue and yellow light. In some embodiments, the blue LED light can be converted by a yellow conversion material using a commercially available YAG:Ce phosphor, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for creating white light when used with a blue emitting LED based emitter include but not limited to:

$Tb_{3-x}RE_xO_{12}$:Ce(TAG); RE=Y, Gd, La, Lu; or
$Sr_{2-x-y}Ba_xCa_ySiO_4$:Eu.

The phosphor layer can also be arranged with more than one phosphor either mixed in the phosphor layer 66 or as a separate phosphor layer/regions either vertically or laterally on the carrier layer 64. In some embodiments, each of the two phosphors can absorb the LED light and can re-emit different colors of light. In these embodiments, the colors from the two phosphor layers can be combined for higher CRI white of different white hue (warm white). This can include light from yellow phosphors above that can be combined with light from red phosphors. Different red phosphors can be used including:

$Sr_xCa_{1-x}S$:Eu, Y; Y=halide;
$CaSiAlN_3$:Eu; or
$Sr_{2-y}Ca_ySiO_4$:Eu

Other phosphors can be used to create color emission by converting substantially all light to a particular color. For example, the following phosphors can be used to generate green light:

$SrGa_2S_4$:Eu;
$Sr_{2-y}Ba_ySiO_4$:Eu; or
$SrSi_2O_2N_2$:Eu.

The following lists some additional suitable phosphors used as conversion particles phosphor layer 66, although others can be used. Each exhibits excitation in the blue and/or UV emission spectrum, provides a desirable peak emission, has efficient light conversion, and has acceptable Stokes shift:

Yellow/Green
$(Sr,Ca,Ba)(Al,Ga)_2S_4$:Eu$^{2+}$
$Ba_2(Mg,Zn)Si_2O_7$:Eu$^{2+}$
$Gd_{0.46}Sr_{0.31}Al_{1.23}O_xF_{1.38}$:Eu$^{2+}{}_{0.06}$
$(Ba_{1-x-y}Sr_xCa_y)SiO_4$:Eu
$Ba_2SiO_4$:Eu$^{2+}$ Red
$Lu_2O_3$:Eu$^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3$:Pr$^{3+}$,Ga$^{3+}$
$CaAlSiN_3$:Eu$^{2+}$
$Sr_2Si_5N_8$:Eu$^{2+}$ Different sized phosphor particles can be used including but not limited to particles in the range of 10 nanometers (nm) to 30 micrometers (μm), or larger. Smaller particle sizes typically scatter and mix colors better than larger sized particles to provide a more uniform light. Larger particles are typically more efficient at converting light compared to smaller particles, but emit a less uniform light. In some embodiments, the phosphor can be provided in the phosphor layer 66 in a binder, and the phosphor can also have different concentrations or loading of phosphor materials in the binder. A typical concentration being in a range of 30-70% by weight. In one embodiment, the phosphor concentration is approximately 65% by weight, and is preferably uniformly dispersed throughout the remote phosphor. The phosphor layer 66 can also have different regions with different conversion materials and different concentrations of conversion material.

Different materials can be used for the binder, with materials preferably being robust after curing and substantially transparent in the visible wavelength spectrum. Suitable materials include silicones, epoxies, glass, inorganic glass, dielectrics, BCB, polymides, polymers and hybrids thereof, with the preferred material being silicone because of its high transparency and reliability in high power LEDs. Suitable phenyl- and methyl-based silicones are commercially available from Dow® Chemical. The binder can be cured using many different curing methods depending on different factors such as the type of binder used. Different curing methods include but are not limited to heat, ultraviolet (UV), infrared (IR) or air curing.

Phosphor layer 66 can be applied using different processes including but not limited to spray coating, spin coating, sputtering, printing, powder coating, electrophoretic deposition (EPD), electrostatic deposition, among others. As mentioned above, the phosphor layer 66 can be applied along with a binder material, but it is understood that a binder is not required. In still other embodiments, the phosphor layer 66 can be separately fabricated and then mounted to the carrier layer 64.

In one embodiment, a phosphor-binder mixture can be sprayed or dispersed over the carrier layer 64 with the binder then being cured to form the phosphor layer 66. In some of these embodiments the phosphor-binder mixture can be sprayed or dispersed on a heated carrier layer 64 so that when the phosphor binder mixture contacts the carrier layer 64, heat from the carrier layer 64 spreads into and cures the binder. These processes can also include a solvent in the phosphor-binder mixture that can liquefy and lower the viscosity of the mixture making it more compatible with spraying. Many different solvents can be used including but not limited to toluene, benzene, zylene, or OS-20 commercially available from Dow Corning®, and different concentration of the solvent can be used. When the solvent-phosphor-binder mixture is sprayed or dispersed on the heated carrier layer 64 the heat from the carrier layer 64 evaporates the solvent, with the temperature of the carrier layer impacting how quickly the solvent is evaporated. The heat from the carrier layer 64 can also cure the binder in the mixture leaving a fixed phosphor layer on the carrier layer. The carrier layer 64 can be heated to many different temperatures depending on the materials being used and the desired solvent evaporation and binder curing speed. A suitable range of temperature is 90 to 150° C., but it is understood that other temperatures can also be used. Various deposition methods and systems are described in U.S. Patent Application Publication No. 2010/0155763, to Donofrio et al., titled "Systems and Methods for Application of Optical Materials to Optical Elements," and also assigned to Cree, Inc. and incorporated herein in its entirety.

The phosphor layer 66 can have many different thicknesses depending on the concentration of phosphor material and the desired amount of light to be converted by the phosphor layer 66. Phosphor layers according to the present invention can be applied with concentration levels (phosphor loading) above 30%. Other embodiments can have concentration levels above 50%, while in still others the concentration level can be above 60%. In some embodiments the phosphor layer can have thicknesses in the range of 10-100 microns, while in other embodiments it can have thicknesses in the range of 40-50 microns.

The methods described above can be used to apply multiple layers of the same of different phosphor materials and different phosphor materials can be applied in different areas/regions of the carrier layer using known masking and/or printing processes. The methods described above provide some thickness control for the phosphor layer 66, but for even greater thickness control, the phosphor layer can be grinded using known methods to reduce the thickness of the phosphor layer 66 or to even out the thickness over the entire layer. This grinding feature provides the added advantage of being able to produce lamps emitting within a single bin on the CIE chromaticity graph. Binning is generally known in the art and is intended to ensure that the LEDs or lamps provided to the end customer emit light within an acceptable color range. The LEDs or lamps can be tested and sorted by color or brightness into different bins, generally referred to in the art as binning. Each bin typically contains LEDs or lamps from one color and brightness group and is typically identified by a bin code. White emitting LEDs or lamps can be sorted by chromaticity (color) and luminous flux (brightness). The thickness control of the phosphor layer provides greater control in producing lamps that emit light within a target bin by controlling the amount of light source light converted by the phosphor layer. Multiple phosphor carriers with the same thickness of phosphor layer 66 can be provided. By using a light source 58 with substantially the same emission characteristics, lamps can be manufactured having nearly a color point that in some instances can fall within a single color bin. In some embodiments, the lamp emissions fall within a standard deviation from a point on a CIE diagram, and in some embodiments the standard deviation comprises less than a 10-step McAdams ellipse. In some embodiments the emission of the lamps falls within a 4-step McAdams ellipse centered at CIExy(0.313, 0.323).

The phosphor carrier 62 can be mounted and bonded over the opening in the cavity 54 using different known methods or materials such as thermally conductive bonding materials or a thermal grease. Conventional thermally conductive grease can contain ceramic materials such as beryllium oxide and aluminum nitride or metal particles such colloidal silver. In other embodiments the phosphor carrier can be mounted over the opening using thermal conductive devices such as clamping mechanisms, screws, or thermal adhesive hold phosphor carrier 62 tightly to the heat sink structure to maximize thermal conductivity. In one embodiment a thermal grease layer is used having a thickness of approximately 100 μm and thermal conductivity of k=0.5 W/m-k. This arrangement provides an efficient thermally conductive path for dissipating heat from the phosphor layer 66. During operation of the lamp 50 phosphor conversion heating is concentrated in the phosphor layer 66, such as in the center of the phosphor layer 66 where the majority of LED light strikes and passes through the phosphor carrier 62. The thermally conductive properties of the carrier layer 64 spreads this heat laterally toward the edges of the phosphor carrier 62 as shown by first heat flow 70. There the heat passes through the thermal grease layer and into the heat sink structure 52 as shown by second heat flow 72 where it can efficiently dissipate into the ambient.

As discussed above, in the lamp 50 the platform 56 and the heat sink structure 52 are thermally connected or coupled. This coupled arrangement results in the phosphor carrier 62 and that light source 58 at least partially sharing a thermally conductive path for dissipating heat. Heat passing through the platform 56 from the light source 58 as shown by third heat flow 74 can also spread to the heat sink structure 52. Heat from the phosphor carrier 62 flowing into the heat sink structure 52 can also flow into the platform 56. As further described below, in other embodiments, the phosphor carrier 62 and the light source can have separate thermally conductive paths for dissipating heat, with these separate paths being referred to as "decoupled".

Figure 5:
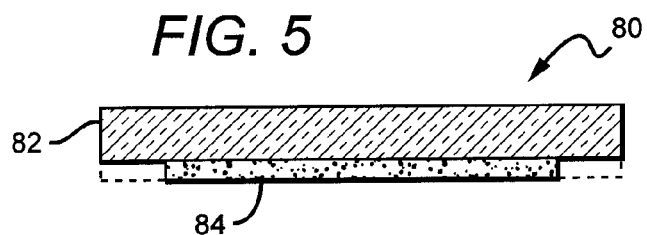
FIG. 5 is a sectional view of another embodiment of a phosphor carrier according to the present invention.

It is understood that the phosphor carriers can be arranged in many different ways beyond the embodiment shown in FIG. 4. Some of these different embodiments are shown in FIGS. 5 through 11, but it is understood that many more arrangements are possible in other embodiments. FIG. 5 shows another embodiment of a phosphor carrier 80 according to the present invention comprising a carrier layer 82 and a phosphor layer 84 that can be made of the same materials described above and can be formed using the same processes. In this embodiment, the phosphor layer 84 is on the bottom surface of the carrier layer 82 so that light from the LED light source passes through the phosphor layer 84 first. Converted light and LED light leaking through the phosphor layer 84 then passes through the carrier layer 82. In this arrangement the carrier layer 82 should be transparent to the light from both the phosphor layer 84 and LED light source. The phosphor layer 84 in this embodiment need not cover the entire bottom surface of the carrier layer 82. Instead, the edge of the carrier layer 82 can be uncovered by the phosphor layer 84 to allow good thermal contact with the heat sink. In some embodiments, however, the phosphor layer 84 can cover the entire bottom surface of the carrier layer 82.

Figure 6:
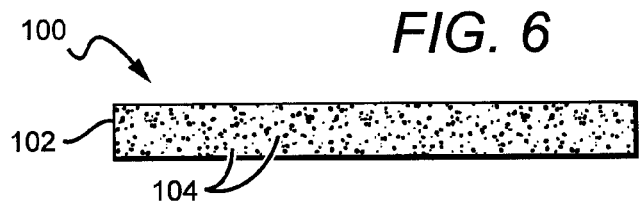
FIG. 6 is a sectional view of another embodiment of a phosphor carrier according to the present invention.

FIG. 6 shows still another embodiment of a phosphor carrier 100 according to the present invention which instead of comprising separate phosphor and carrier layers, comprises a carrier layer 102 with a phosphor 104 dispersed throughout. Just as with the previous embodiments, as heat is generated by the phosphor during conversion, the heat is spread laterally through the carrier layer 102 where it can dissipate in the heat sink. In this embodiment, the phosphor 104 is dispersed in the carrier layer in a nearly uniform concentration, but it is understood that in other embodiments, the phosphor 104 can have different concentrations in different regions of the carrier layer 102. It is also understood that more than one phosphor can be included in the carrier layer, either uniformly dispersed or dispersed in regions of different concentrations.

Figure 7:
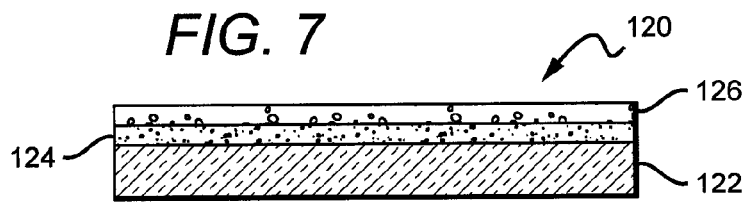
FIG. 7 is a sectional view of another embodiment of a phosphor carrier according to the present invention.

FIG. 7 shows another embodiment of phosphor carrier 120 according to the present invention also comprising a carrier layer 122 and phosphor layer 124 similar to those same elements described above and shown in FIG. 4. In this embodiment, a scattering particle layer 126 can be included on the carrier layer 122 and is shown on the phosphor layer 124. It is understood that it can be in many different locations on or in the carrier layer. The scattering particle layer is included to disperse the light as it emits from the phosphor carrier layer 120 to give it the desired emission pattern. In this embodiment, the scattering particles are arranged to disperse the light in generally uniform pattern.

In some embodiments the scattering particles layer can be deposited using the methods described above with reference to deposition of the phosphor layer and can comprise a dense packing of particles. The scattering particles can also be included in a binder material that can be the same as those described above in reference to the binder used with the phosphor layer. The scattering particle layer can have different concentrations of scattering particles depending on the application and materials used. A suitable range for scattering particle concentration is from 0.01% to 0.2%, but it is understood that the concentration can be higher or lower. In some embodiments the concentration can be as low as 0.001%. It is also understood that the scattering particle layer 126 can have different concentrations of scattering particles in different regions. For some scattering particles there can be an increase in loss due to absorption for higher concentrations. Thus, the concentrations of the scattering particles can be chosen in order to maintain an acceptable loss figure, while at the same time dispersing the light to provide the desired emission pattern.

The scattering particles can comprise many different materials including but not limited to:
- silica gel;
- zinc oxide (ZnO);
- yttrium oxide ($Y_2O_3$);
- titanium dioxide ($TiO_2$);
- barium sulfate ($BaSO_4$);
- alumina ($Al_2O_3$);
- fused silica ($SiO_2$);
- fumed silica ($SiO_2$);
- aluminum nitride;
- glass beads;
- zirconium dioxide ($ZrO_2$);
- silicon carbide (SiC);
- tantalum oxide ($TaO_5$);
- silicon nitride ($Si_3N_4$);
- niobium oxide ($Nb_2O_5$);
- boron nitride (BN); or
- phosphor particles (e.g., YAG:Ce, BOSE)

More than one scattering material in various combinations of materials or combinations of different forms of the same material may be used to achieve a particular scattering effect. It is understood that in other embodiments the scattering particle can be included in the carrier layer 122, the phosphor layer 124, or both.

Figure 8:
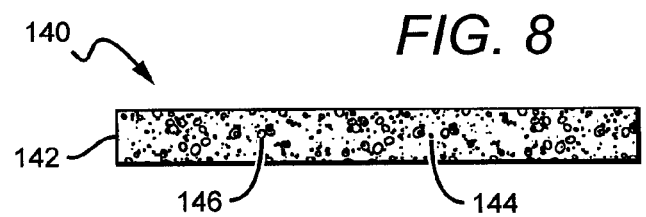
FIG. 8 is a sectional view of another embodiment of a phosphor carrier according to the present invention.

FIG. 8 shows another embodiment of a phosphor carrier 140 according to the present invention having a carrier layer 142 and phosphor 144 similar to the same elements described above and shown in FIG. 6. In this embodiment, scattering particles 146 are dispersed in the carrier layer 142 to disperse both the LED light and phosphor light passing through the carrier layer 142. The same scattering particles can be used as those described above and they can be included in different concentration in different embodiments. Other embodiments can comprise regions of different concentration so that light passing through the carrier layer is scattered to the desired emission pattern.

Figure 9:
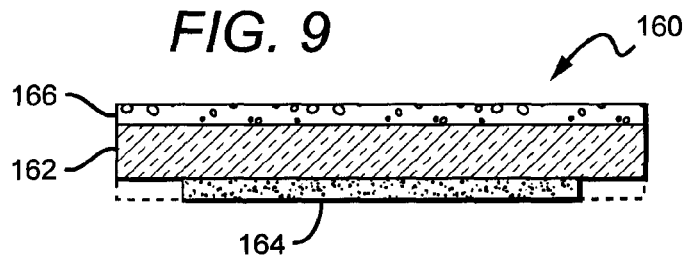
FIG. 9 is a sectional view of another embodiment of a phosphor carrier according to the present invention.

FIG. 9 shows another embodiment of a phosphor carrier 160 according to the present invention comprising a carrier layer 162 with a phosphor layer 164 on its bottom surface, with both arranged similarly to the same element described above and shown in FIG. 5. In this embodiment a scattering particle layer 166 is included on the top surface of the carrier layer 162 and can have the same materials deposited in the same way as scattering particle layer 126 in FIG. 7. In some embodiments the scatting particles in the scattering particle layer 166 can be arranged to scatter both the light from the phosphor layer 164 as well as the LED light leaking through the phosphor layer 164. In still other embodiments, the scattering particles can be arranged to scatter only one of these. It is understood that the scattering particles can also be dispersed in the carrier layer 162 or the phosphor layer 164, or both.

Figure 10:
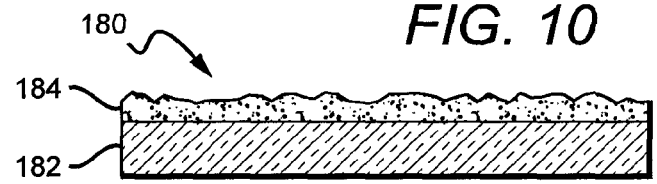
FIG. 10 is a sectional view of another embodiment of a phosphor carrier according to the present invention.

Other embodiments of the phosphor carrier can also comprise features to enhance light extraction from the lamp. Certain amount of light may strike the surface of the carrier layer or phosphor layer outside the angle of escape, such that the light will be reflected back toward the cavity of the heat sink structure. Some of this light can be absorbed, while other portions of the light may experience total internal reflection (TIR). FIG. 10 shows one embodiment of a phosphor carrier 180 having features arranged to reduce these losses. Like the embodiments above, the phosphor carrier comprises a carrier layer 182 and a phosphor layer 184. In this embodiment, the surface of the phosphor layer is roughened or shaped to provide varying surface angles. This can increase the likelihood that light will strike the surface within its escape angle so that it can contribute to useful emission. The surface can be shaped using known roughing or etching processes. The phosphor carrier layer 182 can also be arranged with scattering particles in different locations to disperse light as described above.

Figure 11:
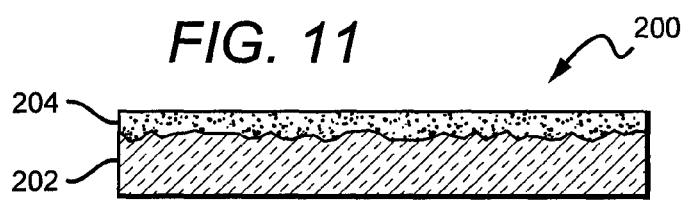
FIG. 11 is a sectional view of still another embodiment of a phosphor carrier according to the present invention.

The shaping or roughening can be included on different surfaces of phosphor carriers according to the present invention. FIG. 11 shows another embodiment of a phosphor carrier 200 according to the present invention comprising a carrier layer 202 and a phosphor layer 204. In this embodiment, the shaped/roughened layer is provided on the top surface of the carrier layer 202, with the phosphor layer provided on the roughened surface. The shape/roughened surface provides a varying surface that increases the likelihood that light will escape through the phosphor carrier 200. The roughened surface can be included on other surfaces of the carrier layer 202, and the phosphor carrier 200 can also be arranged with scattering particles as described above. It is further understood that the roughened surface can be included on any of the surfaces of the different phosphor carrier layer embodiments described above.

The lamps according to the present invention can comprise many different features beyond those described above. Referring again to FIG. 4, in some embodiments the cavity 54 can be filled with a transparent heat conductive material to further enhance heat dissipation for the lamp. The cavity conductive material could provide a secondary path for dissipating heat from the light source 58. Heat from the light source would still conduct through the platform 56, but could also pass through the cavity material to the heat sink structure 52. This would allow for lower operating temperature for the light source 58, but presents the danger of elevated operating temperature for the phosphor carrier 62. This arrangement can be used in many different embodiments, but is particularly applicable to lamps having higher light source operating temperatures compared to that of the phosphor carrier. This arrangement allows for the heat to be more efficiently spread from the light source in applications where additional heating of the phosphor carrier layer can be tolerated.

Figure 12:
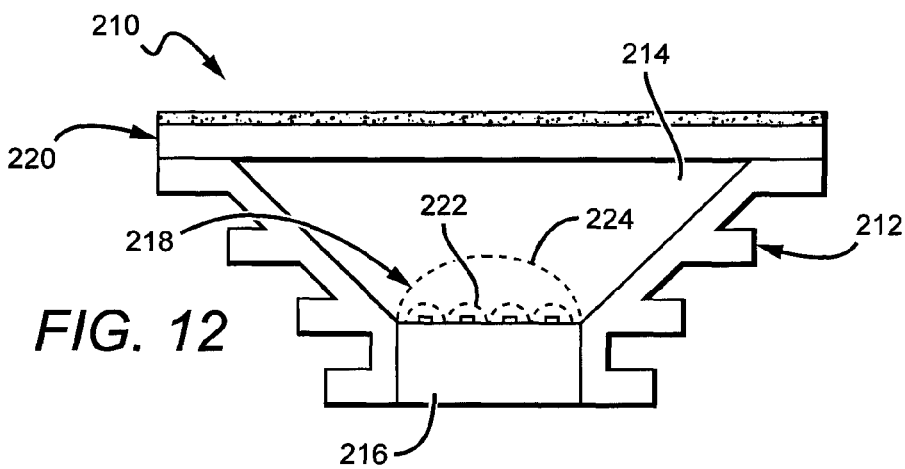
FIG. 12 is a sectional view of another embodiment of a lamp according to the present invention.

As discussed above, different lamp embodiments according to the present invention can be arranged with many different types of light sources. FIG. 12 shows another embodiment of a lamp 210 similar to the lamp 50 described above and shown in FIG. 4. The lamp 210 comprises a heat sink structure 212 having a cavity 214 with a platform 216 arranged to hold a light source 218. A phosphor carrier 220 can be included over and at least partially covering the opening to the cavity 214. In this embodiment, the light source 218 can comprise a plurality of LEDs arranged in separate LED packages or arranged in an array in a single multiple LED package. In each embodiment, the emitters can be coupled on different series and parallel arrangement. In one embodiment eight LEDs can be used that are connected in series with two wires to a circuit board. The wires can then be connected to the power supply unit described above. In other embodiments, more or less than eight LEDs can be used and as mentioned above, commercially available LEDs from Cree, Inc. can used including eight XLamp® XP-E LEDs or four XLamp® XP-G LEDs. Different single string LED circuits are described in U.S. patent application Ser. No. 12/566,195, to van de Ven et al., entitled "Color Control of Single String Light Emitting Devices Having Single String Color Control, and U.S. patent application Ser. No. 12/704,730 to van de Ven et al., entitled "Solid State Lighting Apparatus with Compensation Bypass Circuits and Methods of Operation Thereof", both of with are incorporated herein by reference.

For the embodiments comprising separate LED packages, each of the LEDs can comprise its own LED primary optics or lens 222. In embodiments having a single multiple LED package, a single primary optics or lens 224 can cover all the LEDs. It is understood that the LEDs can be provided without lenses and that in the array embodiments each of the LEDs can have its own lens. Likewise, unpackaged LEDs can be provided in a "chip on heat sink" or "chip on board" configuration. It is also understood that each can be provided with secondary optics arranged in different ways. Like the lamp 50, the heat sink structure and platform can be arranged with the necessary electrical traces or wires to provide an electrical signal to the light source 218.

Figure 13:
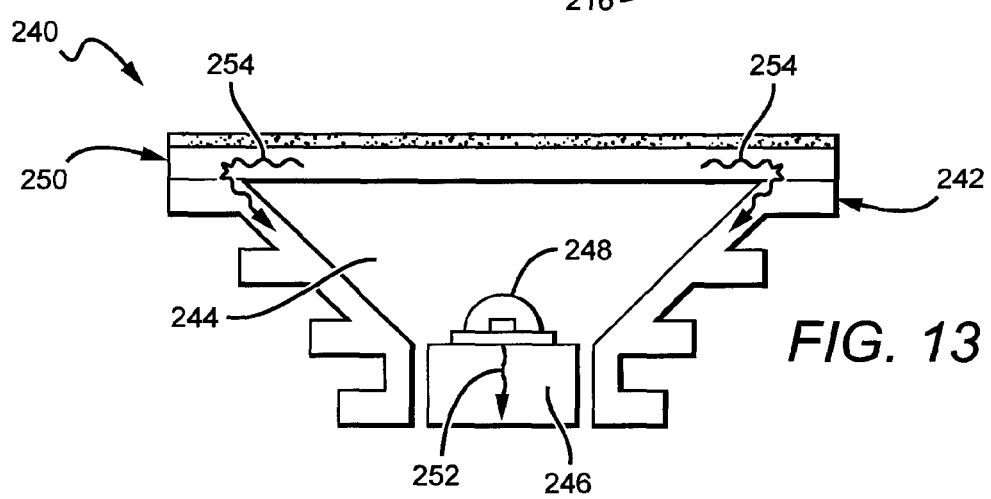
FIG. 13 is a sectional view of another embodiment of a lamp according to the present invention.

In the lamps 50 and 210 described above, the light source and the phosphor carrier share a thermal path for dissipating heat, referred to as being thermally coupled. In some embodiments the heat dissipation of the phosphor carrier may be enhanced if the thermal paths for the phosphor carrier and the light source are not thermally connected, referred to as thermally decoupled. FIG. 13 shows another embodiment of a lamp 240 according to the present invention also comprising a heat sink structure 242 with a cavity 244 with a platform 246 for mounting a light source 248. A phosphor carrier 250 is mounted by a thermally conductive material over and at least partially covering the opening to the cavity 244 so that at least some of the light from the light source passes through the phosphor carrier 250. In this embodiment the heat sink structure 242 and platform 246 have separate thermal dissipation paths that are substantially thermally isolated from one another (although convection may cause some thermal coupling between the two). The heat from the light source 248 conducts along fourth heat flow 252 and through the platform 246 where it can dissipate into the ambient or another heat sink structure (not shown), such as the connection of the lamp. Heat from the phosphor carrier 250 conducts along fifth heat flow 254 and into the heat sink structure 242 where it dissipates into the ambient. The thermal separation between the heat sink structure 242 and the platform 246 can be provided by physical separation of the two or by providing a thermally resistant material between the two such as through known thermal insulators (e.g. dielectrics).

Figure 14:
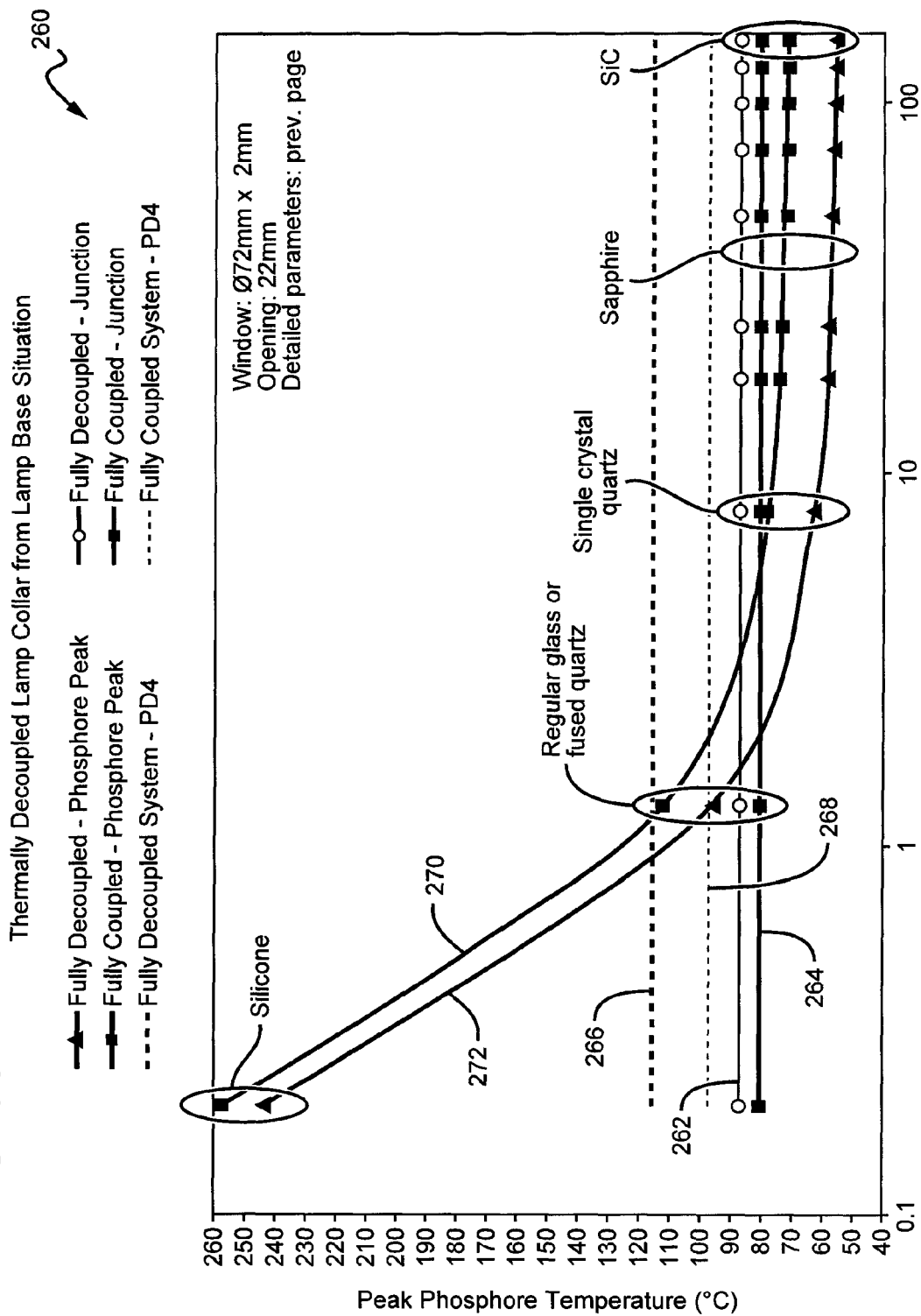
FIG. 14 is a graph showing operating temperatures for different emitters and features of the lamps according to the present invention.

FIG. 14 is a graph 260 showing the peak operating temperatures for conformal phosphor material compared to the operating temperature of remote phosphor carriers having carrier layers with different thermal conductivity and arranged so that heat can dissipate through thermal paths as described above. The graph 260 further compares the thermal performance of these different arrangements for thermally coupled and thermally decoupled heat sinks. First solid line 262 shows the junction temperature of the emitters having a heat sink that is thermally decoupled as described above, and second solid line 264 shows the junction temperature of the emitters for a thermally coupled heat sink. The operating temperature for the coupled arrangement is slightly lower than that of the decoupled arrangement. First dashed line 266 shows the peak phosphor temperature for a lamp having LEDs with a conformal phosphor coating and a thermally decoupled heat sink. Second dashed line 268 shows the peak phosphor temperature for the same lamp with a thermally coupled heat sink. In the conformal coating arrangement, the phosphor operates a generally consistent peak phosphor temperature and the thermally coupled lamp operates at a lower peak phosphor temperature compared to the decoupled arrangement.

By comparison, the third solid line 270 shows the peak phosphor temperature for a remote phosphor carrier arranged on a thermally coupled heat sink, with the temperature measured for carrier layers of different thermal conductivities in the range of 0.2 to more that 100 w/m-K. Fourth solid line 272 shows the same remote phosphor carrier and same range of thermal conductivities, with the phosphor carrier on a thermally decoupled heat sink. The remote phosphor carriers having carrier layers with thermal conductivity of above 1.05 W/m-k and arranged on a thermally decoupled heat sink can operate with lower phosphor temperature, thus higher conversion efficiency than conformal phosphor coated LEDs. This allows for the use of material such as regular glass, fused quartz, sapphire and silicon carbide. Thermally coupled heat sinks can be used but require a somewhat higher thermal conductivity and operates at a higher temperature compared to the thermally coupled arrangements.

FIG. 15 shows another embodiment of lamp 270 according to the present invention arranged in a different way to provide the desired remote phosphor and thermal characteristics for the phosphor carrier. The lamp 270 comprises a light source 272 mounted on the top surface of heat sink structure 274. The heat sink structure can be made of a heat conductive material as described above, and comprise heat dissipating structures such as fins 275. During operation, heat spreads from the light source 272 into the heat sink structure 274 where it spreads into the fins 275 and the ambient.

The lamp 270 also comprises a lamp collar 276 having a collar cavity 278, mounted on the top surface of the heat sink structure 274. The collar cavity 278 extends through the lamp collar such that it is open at the bottom and top. When the lamp collar 276 is mounted to the heat sink structure 274, the light source 272 is arranged so that it emits light out the top opening of the collar cavity 278. In this embodiment, the light source 272 is also arranged so that it is within the collar cavity 278.

A phosphor carrier 280 is mounted over the top opening of the collar cavity 278 with a thermally conductive material or device as described above. It is arranged so that light from the light source 272 passes through the phosphor carrier 280, where at least some of it is converted. The phosphor carrier 280 can be arranged with the structures and features described in the different embodiments described above, including but not limited to a carrier layer, phosphor, scattering particles, and/or roughening/shaping. The lamp collar 276 is also made of a heat conductive material so that heat from the phosphor carrier 280 spreads into the lamp collar 276. The heat from the lamp collar 276 can dissipate directly into the ambient or can spread into the heat sink structure 274 where it can spread into the ambient. The heat path for the phosphor carrier and the light source is coupled such that heat from phosphor carrier heat from the lamp collar 276 can spread into the heat sink structure 274, and light source heat can spread from the heat sink structure 274 to the lamp collar 276. The lamp collar 276 also has a skirt 282 that fits closely around the top portion of the heat sink structure 274 to allow for efficient conduction between the lamp collar 276 and heat sink structure 274.

FIG. 16 is a graph 285 showing the operating characteristics for different remote phosphors carriers used in the lamp 270. The first dashed line 286 shows the base or board temperature for the lamp, which remains constant at approximately 74.7° C. for a decoupled heat sink. Second dashed line 288 shows the peak temperature for the phosphor in different embodiments of remote phosphor carriers according to the present invention. For 5 mm thick glass with a spin on phosphor layer and for 0.5 mm thick sapphire with a spin on phosphor layer, the peak phosphor operating temperature is below that of the base. Like above, this allows for greater emission efficiency and less heat related degradation of the phosphor.

Figure 17:
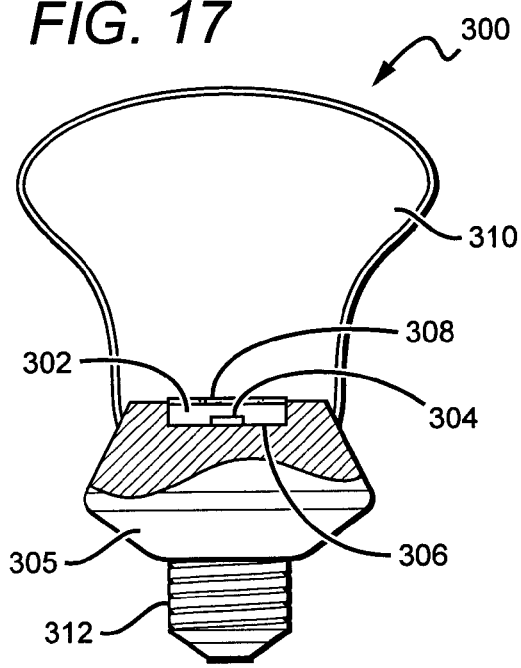
FIG. 17 is a sectional view of another embodiment of a lamp according to the present invention having a diffuser dome.

FIG. 17 shows still another embodiment of lamp 300 according to the present invention that comprises an optical cavity 302 within a heat sink structure 305. An LED based light source 304 is mounted to the platform 306, and a phosphor carrier 308 is mounted to the top opening of the cavity 302, with the phosphor carrier 308 having any of the features of those described above. The phosphor carrier 308 comprises a thermally conductive transparent material and a phosphor, and is mounted to the cavity with a thermally conductive material or device as described above. The cavity 302 can have reflective surfaces to enhance the emission efficiency as described above.

Light from the light source 304 passes through the phosphor carrier 308 where a portion of it is converted to a different wavelength of light by the phosphor in the phosphor carrier 308. In one embodiment the light source 304 can comprise blue emitting LEDs and the phosphor carrier 308 can comprise a yellow phosphor as described above that absorbs a portion of the blue light and re-emits yellow light. The lamp 300 emits a white light combination of LED light and yellow phosphor light. Like above, the light source 304 can also comprise many different LEDs emitting different colors of light and the phosphor carrier can comprise other phosphors to generate light with the desired color temperature and rendering.

The lamp 300 also comprises a shaped diffuser dome 310 mounted over the cavity 302 that includes diffusing or scattering particles such as those listed above. The scattering particles can be provided in a curable binder that is formed in the general shape of dome. Additionally, or alternatively, scattering structures may also be provided as part of the diffuser dome. In some embodiments, scattering structures are provided in lieu of the scattering particles. In the embodiment shown, the dome 310 is mounted to the heat sink structure 305 and has an enlarged portion at the end opposite the heat sink structure 305. Different binder materials can be used as discussed above such as silicones, epoxies, glass, inorganic glass, dielectrics, BCB, polymides, polymers and hybrids thereof. In some embodiments white scattering particles can be used with the dome having a white color that hides the color of the phosphor in the phosphor carrier 308 in the optical cavity. This gives the overall lamp 300 a white appearance that is generally more visually acceptable or appealing to consumers than the color of the phosphor. In one embodiment the diffuser can include white titanium dioxide particles that can give the diffuser dome 310 its overall white appearance.

The diffuser dome 310 can provide the added advantage of distributing the light emitting from the optical cavity in a more omnidirectional and/or uniform pattern. As discussed above, light from the light source in the optical cavity can be emitted in a generally forward or Lambertian pattern and the shape of the dome 310 along with the scattering properties of the scattering particles/structures causes light to emit from the dome in a more omnidirectional emission pattern. An engineered dome can have scattering particles/structures in different concentrations in different regions or can be shaped to a specific emission pattern. In some embodiments the dome can be engineered so that the emission pattern from the lamp complies with the Department of Energy (DOE) Energy Star defined omnidirectional distribution criteria. As described herein, some of the different lamp embodiments described herein can comprise an A-type retrofit LED bulb that meets the DOE Energy Star. One requirement of this standard met by the lamp 300 is that the emission uniformity must be within 20% of mean value from 0 to 135° viewing and; >5% of total flux from the lamp must be emitted in the 135-180° emission zone, with the measurements taken at 0, 45, 90° azimuthal angles. The present invention provides lamps that are efficient, reliable and cost effective. In some embodiments, the entire lamp can comprise five components that can be quickly and easily assembled.

Like the embodiments above, the lamp 300 can comprise a mounting mechanism of the type to fit in conventional electrical receptacles. In the embodiment shown, the lamp 300 includes a screw-threaded portion 312 for mounting to a standard Edison socket. Like the embodiments above, the lamp 300 can include standard plug and the electrical receptacle can be a standard outlet, a bayonet mount, a pin base, such as a GU24 base unit, or it can be a clip and the electrical receptacle can be a receptacle which receives and retains the clip (e.g., as used in many fluorescent lights).

Figure 18:
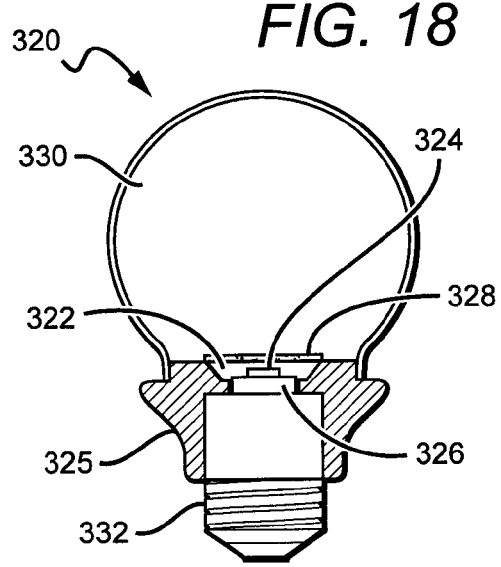
FIG. 18 is a sectional view of another embodiment of a lamp according to the present invention also having a diffuser dome.

Different lamp embodiments according to the present invention can have many different shapes and sizes. FIG. 18 shows another embodiment of a lamp 320 according to the present invention that is similar to the lamp 300 and similarly comprises an optical cavity 322 in a heat sink structure 325 with a light source 324 mounted to the platform 326 in the optical cavity 322. A phosphor carrier 328 is mounted over the cavity opening with a thermal connection. The lamp 320 also comprises a diffuser dome 330 mounted to the heat sink structure 325, over the optical cavity 322. The diffuser dome can be made of the same materials as diffuser dome 310 described above and shown in FIG. 17, but in this embodiment the dome 300 is oval or egg shaped to provide a different lamp emission pattern while still masking the color from the phosphor in the phosphor carrier 328. It is also noted that the heat sink structure 325 and the platform 326 are thermally de-coupled. That is, there is a space between the platform 326 and the heat sink structure such that they do not share a thermal path for dissipating heat. As mentioned above, this can provide improved heat dissipation from the phosphor carrier compared to lamps not having de-coupled heat paths. The lamp 300 also comprises a screw-threaded portion 332 for mounting to an Edison socket.

Figure 19:
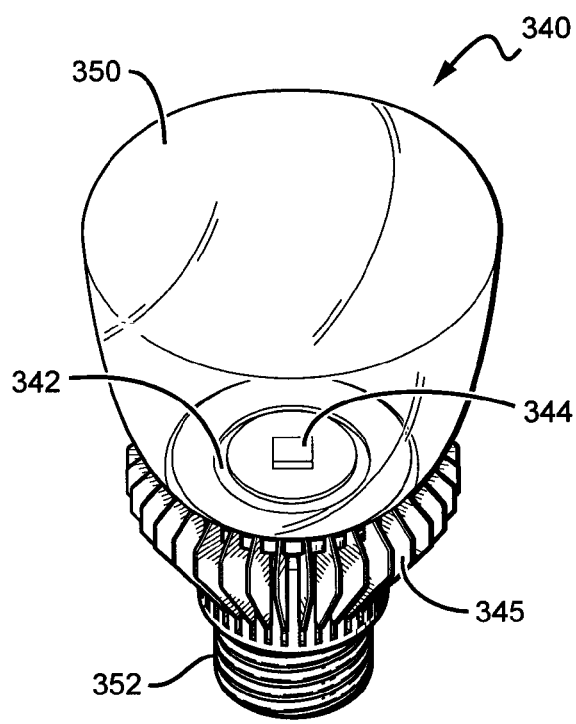
FIG. 19 is a perspective view of another embodiment of a lamp according to the present invention with a diffuser dome having a different shape.
Figure 20:
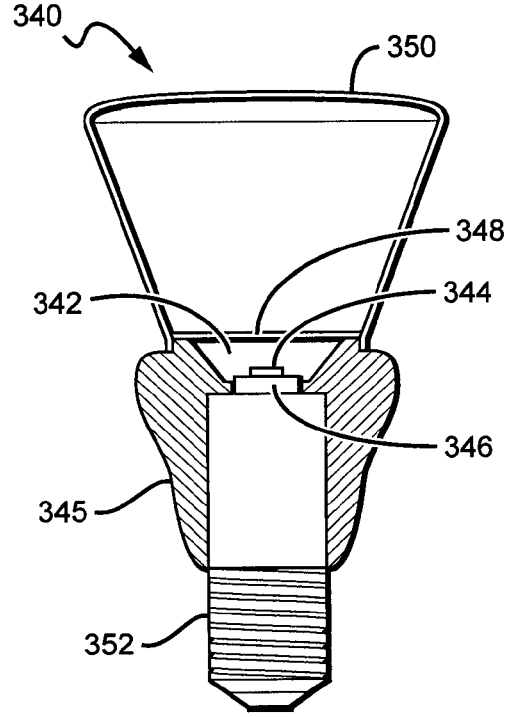
FIG. 20 is a sectional view of the lamp shown in FIG. 19.
Figure 21:
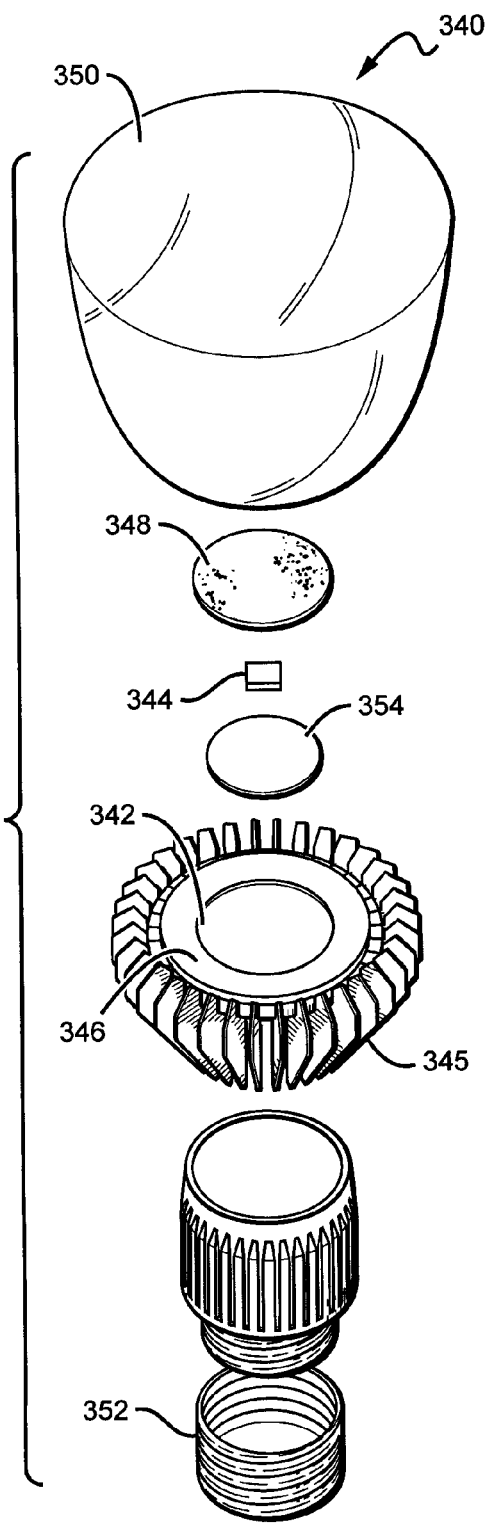
FIG. 21 is an exploded view of the lamp shown in FIG. 19.

FIGS. 19 through 21 show another embodiment of a lamp 340 according to the present invention that is similar to the lamp 320 shown in FIG. 18. It comprises a heat sink structure 345 having an optical cavity 342 with a light source 344 on the platform 346, and a phosphor carrier 348 over the optical cavity 342. It further comprises a screw-threaded portion 352. It also includes a diffuser dome 350, but in this embodiment the diffuser dome is flattened on top to provide the desired emission pattern while still masking the color of the phosphor.

The lamp 340 also comprises an interface layer 354 between the light source 344 and the heat sink structure 345 from the light source 344. In some embodiments the interface layer can comprise a thermally insulating material and the light source 344 can have features that promote dissipation of heat from the emitters to the edge of the light source's substrate. This can promote heat dissipation to the outer edges of the heat sink structure 345 where it can dissipate through the heat fins. In other embodiments the interface layer 354 can be electrically insulating to electrically isolate the heat sink structure 345 from the light source 344. Electrical connection can then be made to the top surface of the light source.

In the embodiments above, the phosphor carriers are flat planar with the LEDs in the light source being co-planer. It is understood, however, that in other lamp embodiments the phosphor carriers can take many different shapes including different three-dimensional shapes. The term three-dimensional is meant to mean any shape other than planar as shown in the above embodiments, and the three-dimensional phosphor carriers can be mounted to a heat sink in the same manner as the two-dimensional planar phosphor carriers described above.

Figure 22:
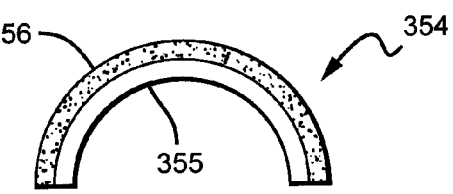
FIG. 22 is a sectional view of one embodiment of a three-dimensional phosphor carrier according to the present invention.

FIGS. 22 through 25 show different embodiments of three-dimensional phosphor carriers according to the present invention, but it is understood that they can also be many other shapes. FIG. 22 shows a hemispheric shaped phosphor carrier 354 comprising a hemispheric carrier 355 and phosphor layer 356. The hemispheric carrier 355 can be made of the same materials as the carrier layers described above, and the phosphor layer can be made of the same materials as the phosphor layer described above, and scattering particles can be included in the carrier and phosphor layer as described above. In some embodiments, the three dimensional carrier need not be thermally conductive.

In this embodiment the phosphor layer 356 is shown on the outside surface of the carrier 355 although it is understood that the phosphor layer can be on the carrier's inside layer, mixed in with the carrier, or any combination of the three. In some embodiments, having the phosphor layer on the outside surface may minimize emission losses. When emitter light is absorbed by the phosphor layer 356 light is emitted omnidirectionally and some of the light can emit backwards and be absorbed by the lamp elements such as the LEDs. In the case where the phosphor layer is located on the inside surface of the carrier, the phosphor layer 356 can also have an index of refraction that is different from (e.g. higher than that of) the hemispheric carrier 355 such that light emitting forward from the phosphor layer can be reflected back from the inside surface of the carrier 355. This light can also be lost due to absorption by the lamp elements. With the phosphor layer 356 on the outside surface of the carrier 355, light emitted forward does not need to pass through the carrier 355 and will not be lost to reflection. Light that is emitted back will encounter the top of the carrier where, particularly if the index of refraction of the phosphor layer is greater than that of the carrier, at least some of it will reflect back. Further, particularly if the index of refraction of the carrier layer is greater than that of the surrounding ambient (e.g., air), some light will be reflected back from the inside surface of the carrier layer. This arrangement results in a reduction of light from the phosphor layer 356 that emits back into the carrier where it can be absorbed. The desired benefit of limiting light directed backwards towards the light source may be further enhanced by, in general, fabricating the surfaces of the phosphor and carrier layers such that they are approximately smooth. Further benefit may be obtained by fabricating the outermost surface of the phosphor layer (when applied to the outer surface of the carrier as shown in FIG. 22) such that it has surface roughness or other features for enhancing light extraction, thereby making forward light extraction from the phosphor layer+carrier layer structure favored with respect to backwards light emission.

The phosphor layer 356 can be deposited using many of the same methods described above. In some instances the three-dimensional shape of the carrier 355 may require additional steps or other processes to provide the necessary coverage. In the embodiments where a solvent-phosphor-binder mixture is sprayed and the carrier can be heated as described above and multiple spray nozzles may be needed to provide the desired coverage over the carrier, such as approximate uniform coverage. In other embodiments, fewer spray nozzles can be used while spinning the carrier to provide the desired coverage. Like above, the heat from the carrier 355 can evaporate the solvent and helps cure the binder.

In still other embodiments, the phosphor layer can be formed through an emersion process whereby the phosphor layer can be formed on the inside and/or outside surface of the carrier 355, but is particularly applicable to forming on the inside surface. The carrier 355 can be at least partially filled with, or otherwise brought into contact with, a phosphor mixture that adheres to the surface of the carrier. The mixture can then be drained from the carrier leaving behind a layer of the phosphor mixture on the surface, which can then be cured. In one embodiment, the mixture can comprise polyethylen oxide (PEO) and a phosphor. The carrier can be filled and then drained, leaving behind a layer of the PEO-phosphor mixture, which can then be heat cured. The PEO evaporates or is driven off by the heat leaving behind a phosphor layer. In some embodiments, a binder can be applied to further fix the phosphor layer, while in other embodiments the phosphor can remain without a binder.

Like the processes used to coat the planar carrier layer, these processes can be utilized in three-dimensional carriers to apply multiple phosphor layers that can have the same or different phosphor materials. The phosphor layers can also be applied both on the inside and outside of the carrier, and can have different types having different thickness in different regions of the carrier. In still other embodiments different processes can be used such as coating the carrier with a sheet of phosphor material that can be thermally formed to the carrier.

In lamps utilizing the carrier 355, an emitter can be arranged at the base of the carrier so that light from the emitters emits up and passes through the carrier 355. The carrier not only converts at least some of the light passing through it, but can also assist in dispersing the light in the desired pattern. In some embodiments the emitters can emit light in a generally Lambertian pattern, and the carrier can help disperse the light in a more uniform pattern.

Figure 23:
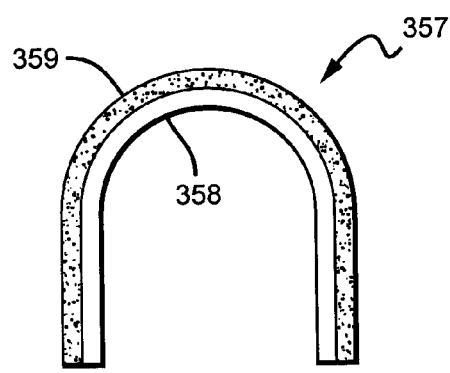
FIG. 23 is a sectional view of another embodiment of a three-dimensional phosphor carrier according to the present invention.
Figure 24:
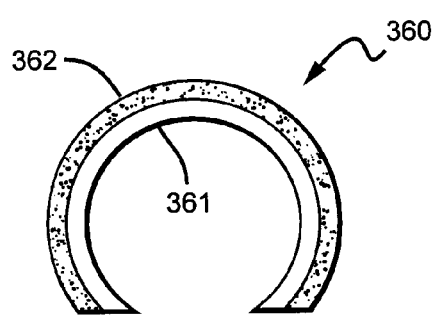
FIG. 24 is a sectional view of another embodiment of a three-dimensional phosphor carrier according to the present invention.

FIG. 23 shows another embodiment of a three dimensional phosphor carrier 357 according to the present invention comprising a bullet-shaped carrier 358 and a phosphor layer 359 on the outside surface of the carrier. The carrier 358 and phosphor layer 359 can be formed of the same materials using the same methods as described above. The different shaped phosphor carrier can be used with different emitters to provide the overall desired lamp emission pattern. FIG. 24 shows still another embodiment of a three dimensional phosphor carrier 360 according to the present invention comprising a globe-shaped carrier 361 and a phosphor layer 362 on the outside surface of the carrier. The carrier 361 and phosphor layer 362 can be formed of the same materials using the same methods as described above.

Figure 25:
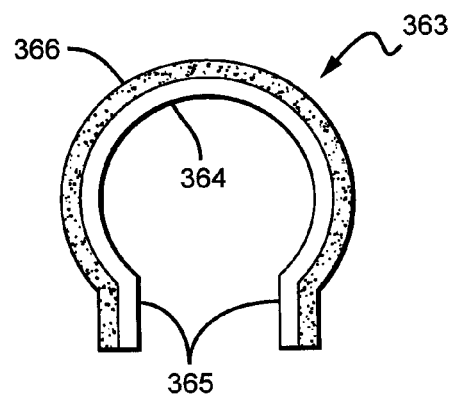
FIG. 25 is a sectional view of another embodiment of a three-dimensional phosphor carrier according to the present invention.

FIG. 25 shows still another embodiment phosphor carrier 363 according to the present invention having a generally globe shaped carrier 364 with a narrow neck portion 365. Like the embodiments above, the phosphor carrier 363 includes a phosphor layer 366 on the outside surface of the carrier 364 made of the same materials and formed using the same methods as those described above. In some embodiments, phosphor carriers having a shape similar to the carrier 364 can be more efficient in converting emitter light and re-emitting light from a Lambertian pattern from the light source, to a more omnidirectional emission pattern.

Figure 26:
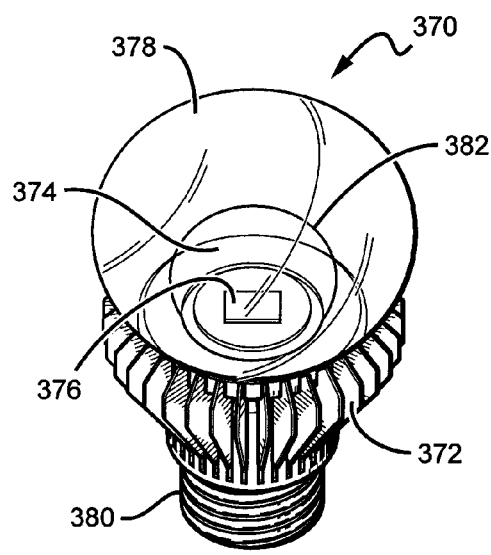
FIG. 26 is a perspective view of another embodiment of a lamp according to the present invention with a diffuser dome having a different shape.
Figure 28:
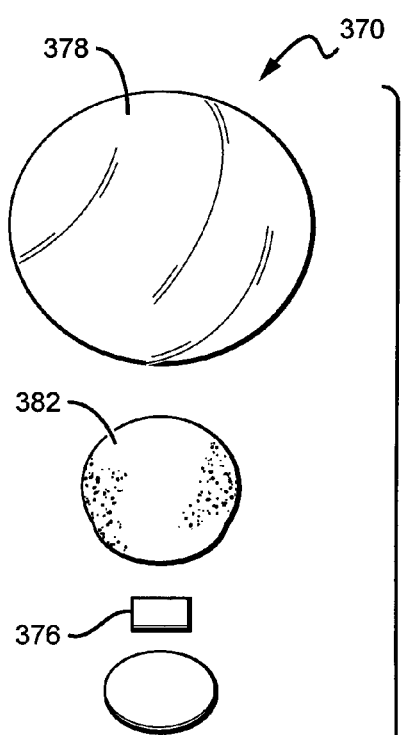
FIG. 28 is an exploded view of the lamp shown in FIG. 26.
Figure 27:
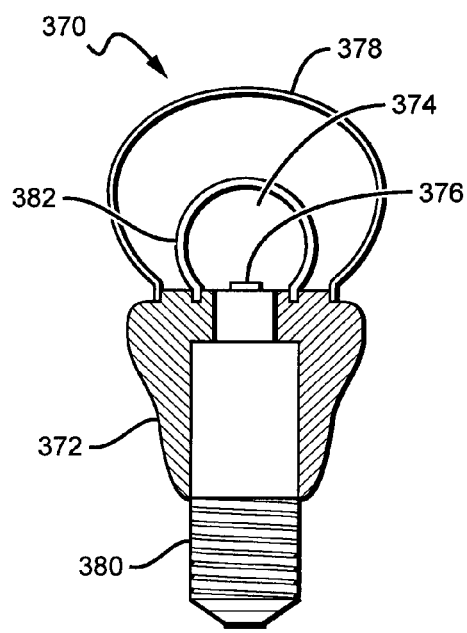
FIG. 27 is a sectional view of the lamp shown in FIG. 26.
Figure 27:
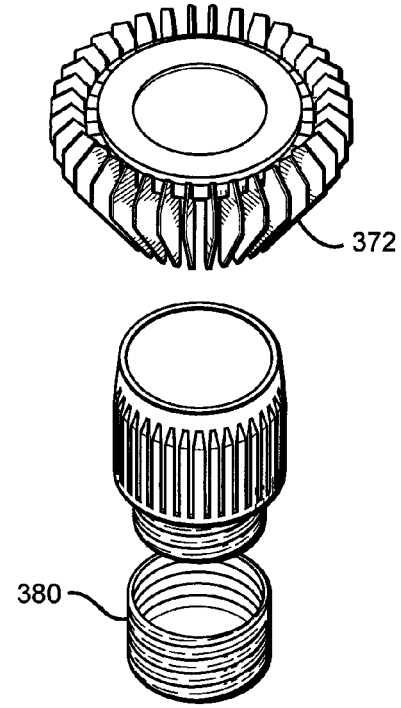

FIGS. 26 through 28 show another embodiment of a lamp 370 according to the present invention having a heat sink structure 372, optical cavity 374, light source 376, diffuser dome 378 and a screw-threaded portion 380. This embodiment also comprises a three-dimensional phosphor carrier 382 that includes a transparent material and at least one phosphor layer. The three-dimensional phosphor carrier 382 may be mounted to the heat sink structure 372 In some embodiments, the carrier 382 is mounted to the heat sink structure with a thermal connection. In this embodiment, however, the phosphor carrier 382 is globe shaped and the emitters are arranged so that light from the light source passes through the phosphor carrier 382 where at least some of it is converted.

The shape of the three dimensional phosphor carrier 382 provides natural separation between it and the light source 376. Accordingly, the light source 376 is not mounted in a recess in the heat sink that forms the optical cavity. Instead, the light source 376 is mounted on the top surface of the heat sink structure 372, with the optical cavity 374 formed by the space between the phosphor carrier 382 and the top of the heat sink structure 372.

In embodiments of the lamp 370 utilizing blue emitting LEDs for the light source 376 and yellow phosphor, the phosphor carrier 382 can appear yellow, and the diffuser dome 378 masks this color while dispersing the lamp light into the desired emission pattern. In lamp 370, the conductive paths for the platform and heat sink structure are coupled, but it is understood that in other embodiments they can be decoupled.

FIGS. 29 through 31 show still another embodiment of a lamp 390 according to the present invention. It comprises many of the same features as the lamp 370 shown in FIGS. 26 through 28. In this embodiment, however, the phosphor carrier 392 is bullet shaped and functions in much the same way as the other embodiments of phosphor carriers described above. It is understood that these are only two of the different shapes that the phosphor carrier can take in different embodiments of the invention.

Figure 32:
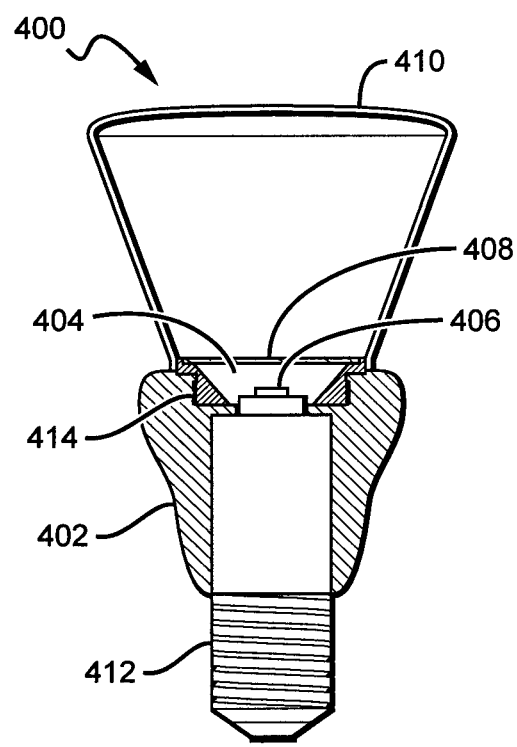
FIG. 32 is a sectional view of another embodiment of a lamp according to the present invention.
Figure 33:
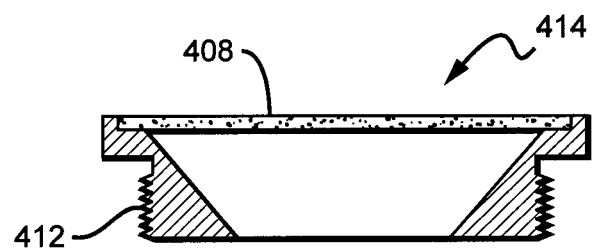
FIG. 33 is a sectional view of one embodiment of a collar cavity according to the present invention.

FIG. 32 shows another embodiment of a lamp 400 according to the present invention that also comprises a heat sink 402 with an optical cavity 404 having a light source 406 and phosphor carrier 408. The lamp 400 also comprises a diffuser dome 410 and screw threaded portion 412. In this embodiment, however, the optical cavity 404 can comprise a separate collar structure 414, as shown in FIG. 33 that is removable from the heat sink 402. This provides a separate piece that can more easily be coated by a reflective material than the entire heat sink. The collar structure 414 can be threaded to mate with threads in the heat sink structure 402. The collar structure 414 can provide the added advantage of mechanically clamping down the PCB to the heat sink. In other embodiments the collar structure 414 can comprise a mechanical snap-on device instead of threads for easier manufacture.

It is understood that in other embodiments different portions of the lamp can be removed such as the entire optical cavity. These features making the collar structure 414 removable could allow for easier coating optical cavity with a reflective layer and could also allow for removal and replacement of the optical cavity in case of failure.

The lamps according to the present invention can have a light source comprising many different numbers of LEDs with some embodiments having less than 30 and other embodiments having less than 20. Still other embodiments can have less than 10 LEDs, with the cost and complexity of the lamp light source generally being lower with fewer LED chips. The area covered by the multiple chips light source in some embodiments can be less than 30 $mm^2$ and in other embodiments less than 20 $mm^2$. In still other embodiments it can be less that 10 $mm^2$. Some embodiments of lamps according to the present invention also provide a steady state lumen output of greater than 400 lumens and in other embodiments greater than 600 lumens. In still other embodiments the lamps can provide steady state lumen output of greater than 800 lumens. Some lamp embodiments can provide this lumen output with the lamp's heat management features allowing the lamp to remain relatively cool to the touch. In one embodiment that lamp remains less that 60° C. to the touch, and in other embodiments it remains less that 50° C. to the touch. In still other embodiments the lamp remains less than 40° C. to the touch.

Some embodiments of lamps according to the present invention can also operate at an efficiency of greater than 40 lumens per watt, and in other embodiments at efficiency of greater than 50 lumens per watt. In still other embodiments the lamps can operate at greater than 55 lumens per watt. Some embodiments of lamps according to the present invention can produce light with a color rendering index (CRI) greater than 70, and in other embodiments with a CRI greater than 80. In still other embodiments the lamps can operate at a CRI greater than 90. One embodiment of a lamp according to the present invention can have phosphors that provide lamp emission with a CRI greater than 80 and a lumen equivalent of radiation (LER) greater than 320 lumens/optical Watt @ 3000K correlated color temperature (CCT).

Lamps according to the present invention can also emit light in a distribution that is within 40% of a mean value in the 0 to 135° viewing angles, and in other embodiment the distribution can be within 30% of a mean value at the same viewing angles. Still other embodiments can have a distribution of 20% of a mean value at the same viewing angles in compliance with Energy Star specifications. The embodiments can also emit light that is greater than 5% of total flux in the 135 to 180° viewing angles.

The embodiments above are discussed with reference to a remote phosphor but it is understood that alternative embodiments can comprise at least some LEDs with conformal phosphor layer. This can be particularly applicable to lamps having light sources emitting different colors of light from different types of emitters. These embodiments can otherwise have some or all of the features described above.

Although the present invention has been described in detail with reference to certain preferred configurations thereof, other versions are possible. Therefore, the spirit and scope of the invention should not be limited to the versions described above.

We claim:

1. A lamp, comprising:
 a light source;
 a three-dimensional non-planar phosphor carrier remote to said light source and comprising a thermally conductive material at least partially transparent to light from said light source, and a conversion material that absorbs light from said light source and emits different wavelengths of light; and
 a heat sink structure, said phosphor carrier thermally coupled to said heat sink structure.

2. The lamp of claim 1, wherein said phosphor carrier comprises a carrier layer and a phosphor layer.

3. The lamp of claim 1, wherein said phosphor carrier comprises scattering particles.

4. The lamp of claim 1, wherein said phosphor carrier comprises a separate layer containing scattering particles.

5. The lamp of claim 1, wherein said phosphor carrier comprises a surface that is roughened or shaped.

6. The lamp of claim 1, wherein heat from said phosphor carrier layer conducts into said heat sink structure through a thermal coupling.

7. The lamp of claim 1, wherein said light source comprises an LED based light source.

8. The lamp of claim 1, wherein said light source comprises a blue emitting LED and said phosphor carrier comprises a phosphor that absorbs blue light and re-emits a different wavelength of light, said lamp emitting a perceived white light combination of blue LED light and conversion material light.

9. The lamp of claim 1, further comprising an optical cavity, said phosphor carrier mounted over an opening in said cavity, said light source mounted within said cavity with light from said light source passing through said phosphor carrier.

10. The lamp of claim 9, wherein said optical cavity comprises reflective surfaces.

11. The lamp of claim 1, further comprising a diffuser element over said phosphor carrier.

12. The lamp of claim 11, wherein said diffuser element disperses light from a narrow or Lambertian emission pattern to a more omnidirectional emission pattern.

13. The lamp of claim 1, wherein said phosphor carrier has a shape from the group comprising hemispheric, bullet shaped, conic, tubular and rectangular.

14. The lamp of claim 1, emitting light with an emission pattern that is Energy Star compliant.

15. The lamp of claim 1, sized to fit an A19 size profile.

16. A light emitting diode (LED) based lamp, comprising:
 an LED light source;
 a three-dimensional non-planar phosphor arranged remote to said light source such that light emitted from said light source passes through said phosphor and is converted by said phosphor; and
 a thermally conductive path to conduct phosphor conversion heat away from said phosphor and to dissipate said heat.

17. The lamp of claim 16, further comprising a heat sink, said thermally conductive path at least partially comprising said heat sink.

18. The lamp of claim 16, wherein said phosphor is arranged in a phosphor carrier.

19. The lamp of claim 18, wherein said phosphor carrier comprises a phosphor layer and a carrier layer.

20. The lamp of claim 18, wherein said phosphor carrier layer comprises a thermally conductive transparent material.

21. The lamp of claim 18, wherein said phosphor carrier comprises a surface that is roughened or shaped.

22. The lamp of claim 16, further comprising scattering particles.

23. The lamp of claim 16, wherein said light source comprises a blue emitting LED and said phosphor absorbs blue light and re-emits a different wavelength of light, said lamp emitting a perceived white light combination of blue LED light and phosphor light.

24. The lamp of claim 16, further comprising an optical cavity, said phosphor arranged over an opening in said cavity, said light source mounted within said cavity with light from said light source passing through said phosphor.

25. The lamp of claim 24, wherein said optical cavity comprises reflective surfaces.

26. The lamp of claim 16, further comprising a diffuser element over said phosphor.

27. The lamp of claim 16, wherein said phosphor has a shape from the group comprising hemispheric, bullet shaped, conic, tubular and rectangular.

28. The lamp of claim 16, emitting light with an emission pattern that is Energy Star compliant.

29. The lamp of claim 16, sized to fit an A19 size profile.

30. A lamp, comprising:
 a heat sink structure;
 a light emitting diode (LED) based light source;
 a phosphor carrier remote to said light source and arranged to absorb light from said light source and re-emit light in different wavelengths, said phosphor carrier comprising a carrier layer and a phosphor layer;
 a first thermally conductive path to conduct conversion generated heat away from said conversion material to said heat sink; and
 a diffuser over said conversion material.

31. The lamp of claim 30, further comprising an optical cavity, said conversion material arranged on an optical cavity opening and said LED based light source arranged in said cavity with light from light source passing through said conversion material.

32. The lamp of claim 31, further comprising a platform within said optical cavity, said light source mounted on said cavity with heat dissipating from said light source through said platform.

33. The lamp of claim 31, wherein said optical cavity comprises reflective surfaces.

34. The lamp of claim 30, wherein heat from said first light source is conducted away from said light source through a second thermally conductive path.

35. The lamp of claim 34, wherein said first and second thermally conductive paths are coupled.

36. The lamp of claim 34, wherein said first and second conductive paths are de-coupled.

37. A lamp, comprising:
a light source;
a heat sink structure;
an optical cavity comprising an phosphor carrier over an opening to said cavity and thermally coupled to said heat sink structure, said light source mounted in said optical cavity remote to said phosphor carrier with light from said light source passing through said phosphor carrier; and
a diffuser element over said optical cavity, with light from said optical cavity passing through said diffuser element;
wherein said diffuser element comprises an enlarged portion at an end opposite said heat sink structure.

38. The lamp of claim 37, wherein said phosphor carrier comprises a thermally conductive material at least partially transparent to light from said light source, and a conversion material that absorbs light from said light source and emits a different wavelength of light.

39. The lamp of claim 37, wherein said diffuser element disperses light from optical cavity to a predominantly omni-directional emission pattern.

40. The lamp of claim 37, wherein said diffuser element comprises scattering particles.

41. The lamp of claim 37, wherein said diffuser element masks the color of said phosphor carrier.

42. The lamp of claim 37, wherein said phosphor carrier is hemispheric.

43. The lamp of claim 37, wherein said phosphor carrier is bullet shaped.

44. The lamp of claim 37, wherein said light source comprises a blue emitting LED and said phosphor carrier absorbs blue light and re-emits a different wavelength of light, said lamp emitting a white light combination of blue LED light and phosphor carrier light.

45. A lamp, comprising:
a light source;
an optical cavity comprising a three-dimensional non-planar phosphor carrier over an opening to said cavity, said light source mounted in said optical cavity remote to said phosphor carrier with light from said light source passing through said phosphor carrier, said optical cavity further comprising reflective surfaces to reflect light from said light source and said phosphor carrier; and
a thermally conductive path to conduct phosphor conversion heat away from said phosphor and to dissipate said heat.

46. The lamp of claim 45, further comprising a diffuser element over said optical cavity, with light from said optical cavity passing through said diffuser element.

47. The lamp of claim 45, further comprising a heat sink, wherein said optical cavity is integral to said heat sink and said thermally conductive path is through said heat sink.

48. The lamp of claim 45, wherein said phosphor carrier is planar.

49. The lamp of claim 45, wherein said phosphor carrier has a three-dimensional shape.

50. A lamp, comprising:
a heat sink structure;
a light emitting diode (LED) based light source;
a conversion material remote to said light source and arranged to absorb light from said light source and re-emit light in different wavelengths; a first thermally conductive path to conduct conversion generated heat away from said conversion material to said heat sink structure;
a shaped diffuser dome comprising an enlarged portion at an end opposite said heat sink structure;
wherein said lamp emits light with an emission pattern that is Energy Star compliant.

51. A lamp, comprising:
a heat sink structure;
a light emitting diode (LED) based light source;
a three-dimensional non-planar phosphor carrier comprising a conversion material remote to said light source and arranged to absorb light from said light source and re-emit light in different wavelengths; and
a first thermally conductive path to conduct conversion generated heat away from said conversion material to said heat sink, wherein said lamp is sized to fit an A19 profile.

* * * * *